(12) United States Patent
Ikeda et al.

(10) Patent No.: US 11,728,355 B2
(45) Date of Patent: *Aug. 15, 2023

(54) IMAGING DEVICE AND ELECTRONIC DEVICE

(71) Applicant: SEMICONDUCTOR ENERGY LABORATORY CO., LTD., Atsugi (JP)

(72) Inventors: Takayuki Ikeda, Kanagawa (JP); Yoshiyuki Kurokawa, Kanagawa (JP); Shintaro Harada, Kanagawa (JP); Hidetomo Kobayashi, Kanagawa (JP); Roh Yamamoto, Toyama (JP); Kiyotaka Kimura, Kanagawa (JP); Takashi Nakagawa, Kanagawa (JP); Yusuke Negoro, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 10 days.

This patent is subject to a terminal disclaimer.

(21) Appl. No.: 17/403,911

(22) Filed: Aug. 17, 2021

(65) Prior Publication Data

US 2021/0384239 A1 Dec. 9, 2021

Related U.S. Application Data

(63) Continuation of application No. 16/615,156, filed as application No. PCT/IB2018/053400 on May 16, 2018, now Pat. No. 11,101,302.

(30) Foreign Application Priority Data

May 26, 2017 (JP) .................................. 2017-104338
Mar. 7, 2018 (JP) .................................. 2018-040915

(51) Int. Cl.
*H01L 27/146* (2006.01)
*H01L 27/12* (2006.01)
(Continued)

(52) U.S. Cl.
CPC .... *H01L 27/14605* (2013.01); *H01L 27/1225* (2013.01); *H01L 27/14612* (2013.01);
(Continued)

(58) Field of Classification Search
None
See application file for complete search history.

(56) References Cited

U.S. PATENT DOCUMENTS 5,303,027 A 4/1994 Kuderer et al.
7,791,662 B2 9/2010 Yoshimura
(Continued)

FOREIGN PATENT DOCUMENTS

EP 0519105 A 12/1992
JP 02-242488 A 9/1990
(Continued)

OTHER PUBLICATIONS

International Search Report (Application No. PCT/IB2018/053400) dated Jul. 17, 2018.
(Continued)

*Primary Examiner* — Long Pham
(74) *Attorney, Agent, or Firm* — Fish & Richardson P.C.

(57) ABSTRACT

An imaging device capable of image processing is provided. The imaging device can retain analog data (image data) obtained by an image-capturing operation in a pixel and perform a product-sum operation of the analog data and a predetermined weight coefficient in the pixel to convert the data into binary data. When the binary data is taken in a neural network or the like, processing such as image recognition can be performed. Since enormous volumes of (Continued)

image data can be retained in pixels in the state of analog data, processing can be performed efficiently.

4 Claims, 26 Drawing Sheets

(51) Int. Cl.
*H01L 29/786* (2006.01)
*H04N 25/40* (2023.01)
*H04N 25/77* (2023.01)
*H04N 25/766* (2023.01)

(52) U.S. Cl.
CPC .... *H01L 27/14643* (2013.01); *H01L 29/7869* (2013.01); *H04N 25/40* (2023.01); *H04N 25/766* (2023.01); *H04N 25/77* (2023.01)

(56) References Cited

U.S. PATENT DOCUMENTS

| | | | |
|---|---|---|---|
| 8,378,391 B2 | 2/2013 | Koyama et al. |
| 8,786,728 B2 | 7/2014 | Ichikawa |
| 8,916,869 B2 | 12/2014 | Koyama et al. |
| 8,970,728 B2 | 3/2015 | Horikawa et al. |
| 9,252,181 B2 | 2/2016 | Lee et al. |
| 9,331,112 B2 | 5/2016 | Koyama et al. |
| 9,773,814 B2 | 9/2017 | Koyama et al. |
| 9,773,832 B2 | 9/2017 | Kurokawa |
| 10,074,687 B2 | 9/2018 | Kurokawa |
| 10,218,922 B2 | 2/2019 | Kondo et al. |
| 11,101,302 B2 * | 8/2021 | Ikeda ............ H01L 27/146 |
| 2007/0152137 A1 | 7/2007 | Barna et al. |
| 2009/0207462 A1 | 8/2009 | Arimoto et al. |
| 2011/0194001 A1 | 8/2011 | Eki et al. |
| 2016/0092735 A1 | 3/2016 | Govil et al. |
| 2016/0172410 A1 | 6/2016 | Kurokawa |
| 2019/0067360 A1 | 2/2019 | Kurokawa |

FOREIGN PATENT DOCUMENTS

| | | |
|---|---|---|
| JP | 2009-064162 A | 3/2009 |
| JP | 2011-119711 A | 6/2011 |
| JP | 2011-134784 A | 7/2011 |
| JP | 2016-123087 A | 7/2016 |
| KR | 2013-0039933 A | 4/2013 |
| WO | WO-2017/009944 | 1/2017 |

OTHER PUBLICATIONS

Written Opinion (Application No. PCT/IB2018/053400) dated Jul. 17, 2018.

\* cited by examiner

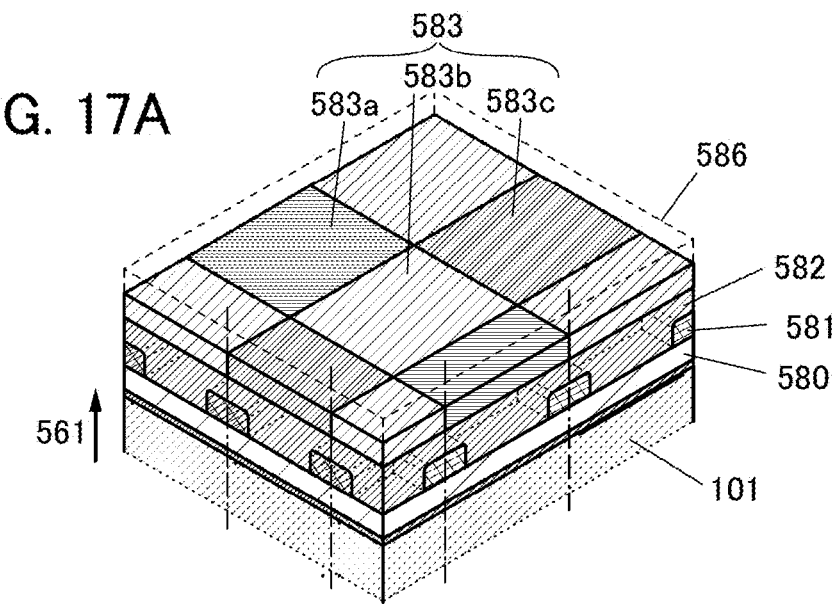
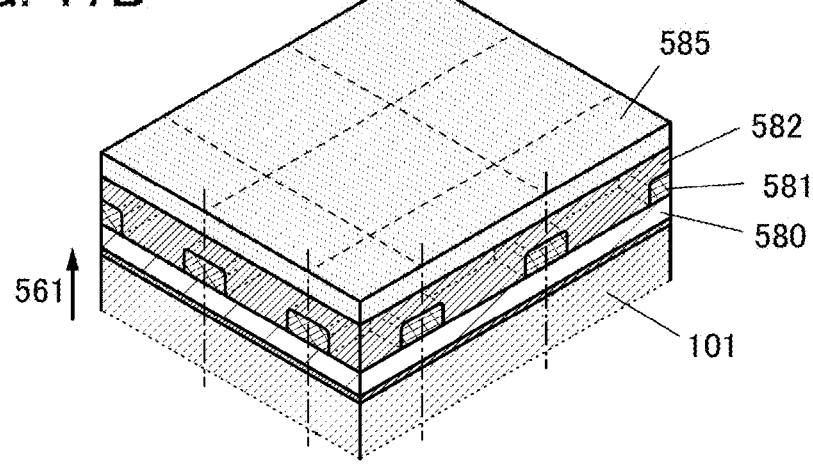
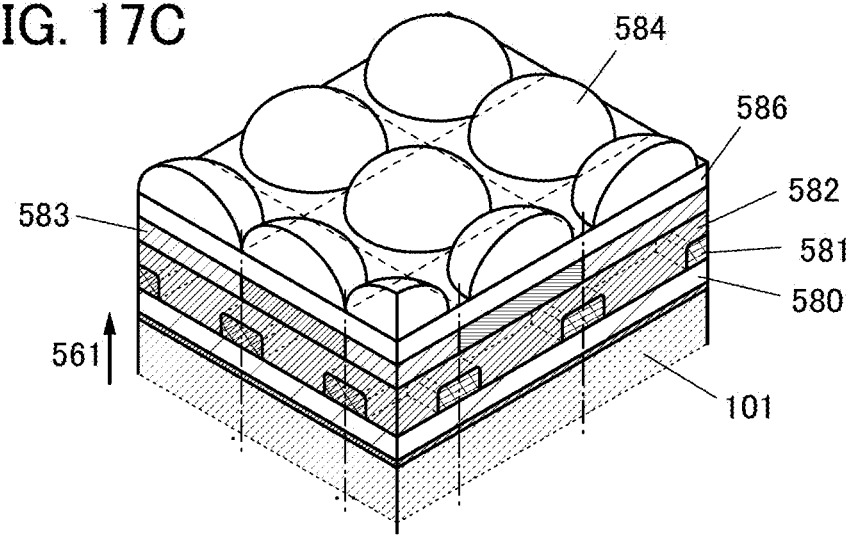

FIG. 18A1
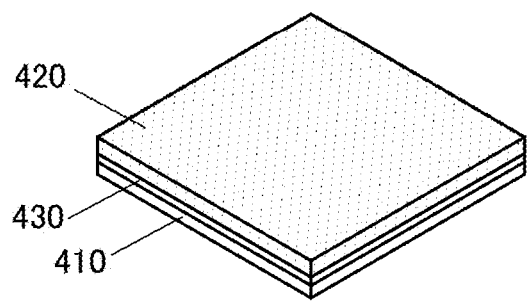
FIG. 18B1
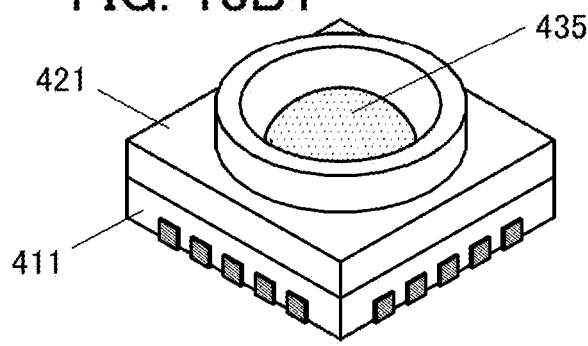
FIG. 18A2
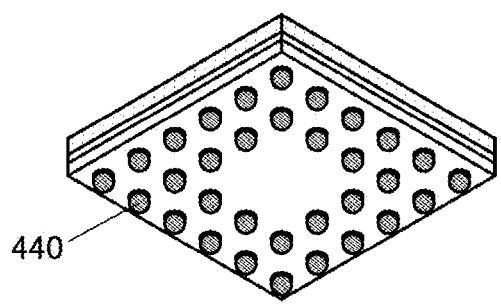
FIG. 18B2
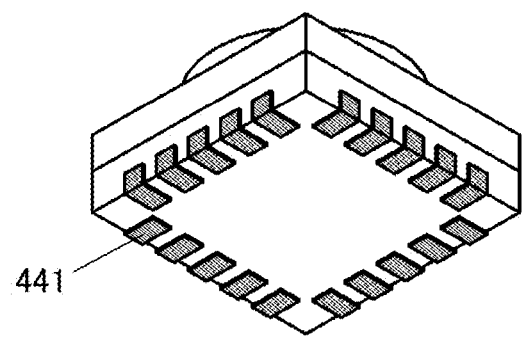
FIG. 18A3
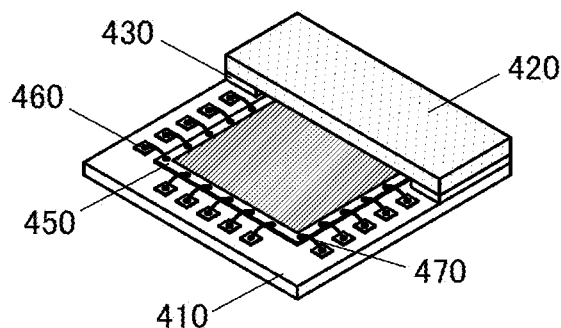
FIG. 18B3
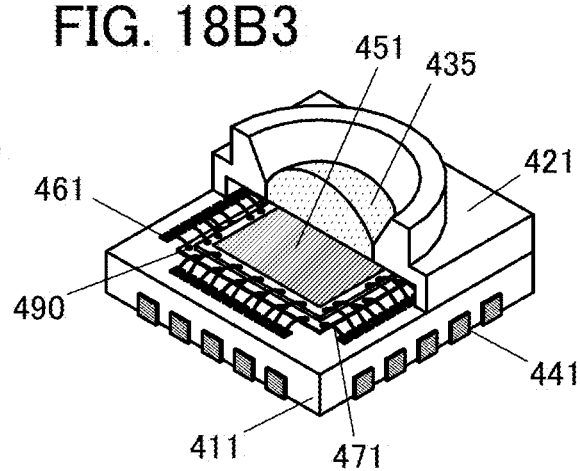

FIG. 23

| 0 | 0 | 1 | 0 | 0 | 1 |
|---|---|---|---|---|---|
| 0 | 0 | 1 | 0 | 0 | 1 |
| 0 | 0 | 1 | 0 | 0 | 1 |
| 0 | 0 | 1 | 0 | 0 | 1 |
| 0 | 0 | 1 | 0 | 0 | 1 |
| 0 | 0 | 1 | 0 | 0 | 1 |

IMAGING DEVICE AND ELECTRONIC DEVICE

CROSS REFERENCE TO RELATED APPLICATIONS

This application is a continuation of U.S. application Ser. No. 16/615,156, filed Nov. 20, 2019, now allowed, which is incorporated by reference and is a U.S. National Phase Application under 35 U.S.C. § 371 of International Application PCT/IB2018/053400, filed on May 16, 2018, which is incorporated by reference, and which claims the benefit of foreign priority applications filed in Japan as Application No. 2017-104338, filed on May 26, 2017, and Application No. 2018-040915, filed on Mar. 7, 2018.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Another one embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device generally means a device that can function by utilizing semiconductor characteristics. A transistor and a semiconductor circuit are embodiments of semiconductor devices. Furthermore, in some cases, a memory device, a display device, an imaging device, or an electronic device includes a semiconductor device.

BACKGROUND ART

A technique which forms a transistor by using an oxide semiconductor thin film formed over a substrate has attracted attention. An imaging device having a structure where a transistor including an oxide semiconductor with an extremely low off-state current is used in a pixel circuit is disclosed in Patent Document 1, for example.

A technique which adds an arithmetic function to an imaging device is disclosed in Patent Document 2.

REFERENCES

[Patent Document 1] Japanese Published Patent Application No. 2011-119711

[Patent Document 2] Japanese Published Patent Application No. 2016-123087

SUMMARY OF THE INVENTION

Problems to be Solved by the Invention

With the technological development, a high-quality image can be easily captured by an imaging device provided with a solid-state imaging element such as a CMOS image sensor. In the next generation, an imaging device is required to be equipped with more intelligent functions.

In the present image data compression, image recognition, or the like, image data (analog data) is converted into digital data, taken out, and then subjected to processing. If the processing can be carried out in the imaging device, higher-speed communication with an external device is achieved, improving user's convenience. Furthermore, load on peripheral devices or power consumption thereof can be reduced. Moreover, if complicated data processing is performed in analog data state, time required for data conversion can be shortened.

Thus, an object of one embodiment of the present invention is to provide an imaging device capable of image processing. Another object is to provide an imaging device capable of recognition of obtained image data. Another object is to provide an imaging device capable of compression of obtained image data.

Another object is to provide an imaging device with low power consumption. Another object is to provide an imaging device capable of high-sensitivity image capturing. Another object is to provide an imaging device with high reliability. Another object is to provide a novel imaging device or the like. Another object is to provide a method for driving the above imaging device. Another object is to provide a novel semiconductor device or the like.

Note that the descriptions of these objects do not disturb the existence of other objects. One embodiment of the present invention does not need to achieve all of these objects. Other objects will be apparent from and can be derived from the description of the specification, the drawings, the claims, and the like.

Means for Solving the Problems

One embodiment of the present invention relates to an imaging device which can retain data in a pixel and perform arithmetic processing on the data.

One embodiment of the present invention is an imaging device which includes a pixel block, a first circuit, and a second circuit. The pixel block includes a plurality of pixels and a third circuit. The pixels and the third circuit are electrically connected to each other through a first wiring. The pixels have a function of obtaining a first signal by photoelectric conversion. The pixels have a function of multiplying the first signal by a predetermined multiplication factor to generate second signals and outputting the second signals to the first wiring. The third circuit has a function of calculating a sum of the second signals output to the first wiring to generate a third signal and outputting the third signal to the first circuit. The first circuit binarizes the third signal to generate a fourth signal and outputs the fourth signal to the second circuit.

The second circuit can have a function of performing parallel-serial conversion on the fourth signal. Alternatively, the second circuit may include a neural network which uses the fourth signal as input data.

It is preferable that the plurality of pixels be arranged in a matrix and any one column be shielded from light.

The following structure is possible: the pixels include a photoelectric conversion element, a first transistor, a second transistor, a third transistor, a fourth transistor, and a first capacitor; one electrode of the photoelectric conversion element is electrically connected to one of a source and a drain of the first transistor; the other of the source and the drain of the first transistor is electrically connected to one of a source and a drain of the second transistor; one of a source and a drain of the second transistor is electrically connected to a gate of the third transistor; the gate of the third transistor is electrically connected to one electrode of the first capacitor; one of a source and a drain of the third transistor is electrically connected to the first wiring; the other electrode of the first capacitor is electrically connected to one of a source and a drain of the fourth transistor; and the first and second transistors include a metal oxide in their channel formation regions.

The pixels may further include a fifth transistor and a sixth transistor, where a gate of the fifth transistor is electrically connected to the gate of the third transistor and one of a source and a drain of the fifth transistor is electrically connected to one of a source and a drain of the sixth transistor.

It is preferable that the third and fourth transistors include silicon in their channel formation regions.

The following structure is possible: the third circuit includes a current supply circuit, a seventh transistor, an eighth transistor, a ninth transistor, a second capacitor, and a resistor; the current supply circuit is electrically connected to the first wiring; the first wiring is electrically connected to one electrode of the second capacitor; the one electrode of the second capacitor is electrically connected to one electrode of the resistor; the other electrode of the second capacitor is electrically connected to one of a source and a drain of the seventh transistor; the one of the source and the drain of the seventh transistor is electrically connected to a gate of the eighth transistor; and one of a source and a drain of the eighth transistor is electrically connected to one of a source and a drain of the ninth transistor.

It is preferable that the seventh to ninth transistors include silicon in their channel formation regions.

It is preferable that the metal oxide include In, Zn, and M (M is Al, Ti, Ga, Sn, Y, Zr, La, Ce, Nd, or Hf).

It is preferable that the photoelectric conversion element include selenium or a compound containing selenium.

Effect of the Invention

With one embodiment of the present invention, an imaging device capable of image processing can be provided. Alternatively, an imaging device capable of recognition of obtained image data can be provided. Alternatively, an imaging device capable of compression of obtained image data can be provided.

Alternatively, an imaging device with low power consumption can be provided. Alternatively, an imaging device capable of high-sensitivity image capturing can be provided. Alternatively, an imaging device with high reliability can be provided. Alternatively, a novel imaging device or the like can be provided. Alternatively, a method for driving the above imaging device can be provided. Alternatively, a novel semiconductor device or the like can be provided.

BRIEF DESCRIPTION OF THE DRAWINGS

FIGS. 17A-17C Diagrams illustrating structures of a pixel in an imaging device.
FIGS. 18A1-18B3 Perspective views of packages and modules in which imaging devices are placed.
FIG. 23 A diagram showing weight coefficients input to pixels.

MODE FOR CARRYING OUT THE INVENTION

Figure 1:
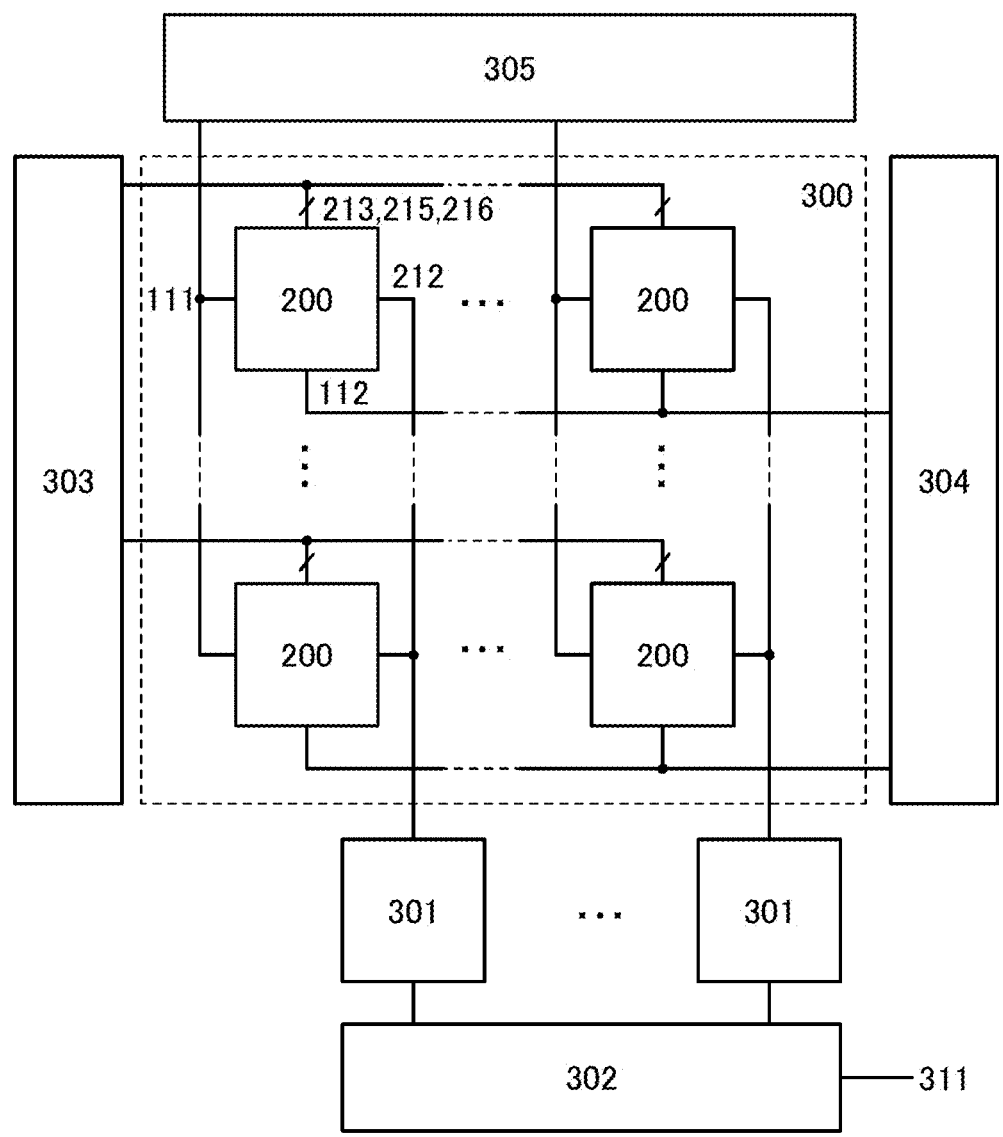
FIG. 1 A block diagram illustrating an imaging device.

Embodiments will be described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the description of embodiments below. Note that in structures of the invention described below, the same reference numerals are used, in different drawings, for the same portions or portions having similar functions, and description thereof is not repeated in some cases. Note that the hatching of the same element that constitutes a drawing is omitted or changed in different drawings in some cases.

Embodiment 1

In this embodiment, an imaging device which is one embodiment of the present invention will be described with reference to drawings.

One embodiment of the present invention is an imaging device having an additional function such as image recognition. The imaging device can retain analog data (image data) obtained by an image-capturing operation in a pixel and extract binary data from data that is obtained by multiplying the analog data by a predetermined weight coefficient.

When the binary data is taken in a neural network or the like, processing such as image recognition can be performed. Since enormous volumes of image data can be retained in pixels in the state of analog data, processing can be performed efficiently.

FIG. 1 is a block diagram illustrating an imaging device of one embodiment of the present invention. The imaging device includes a pixel array 300, circuits 301, a circuit 302, a circuit 303, a circuit 304, and a circuit 305. Note that the structures of the circuits 301 to the circuit 305 are not limited to single circuits and may consist of a plurality of circuits.

Figure 2:
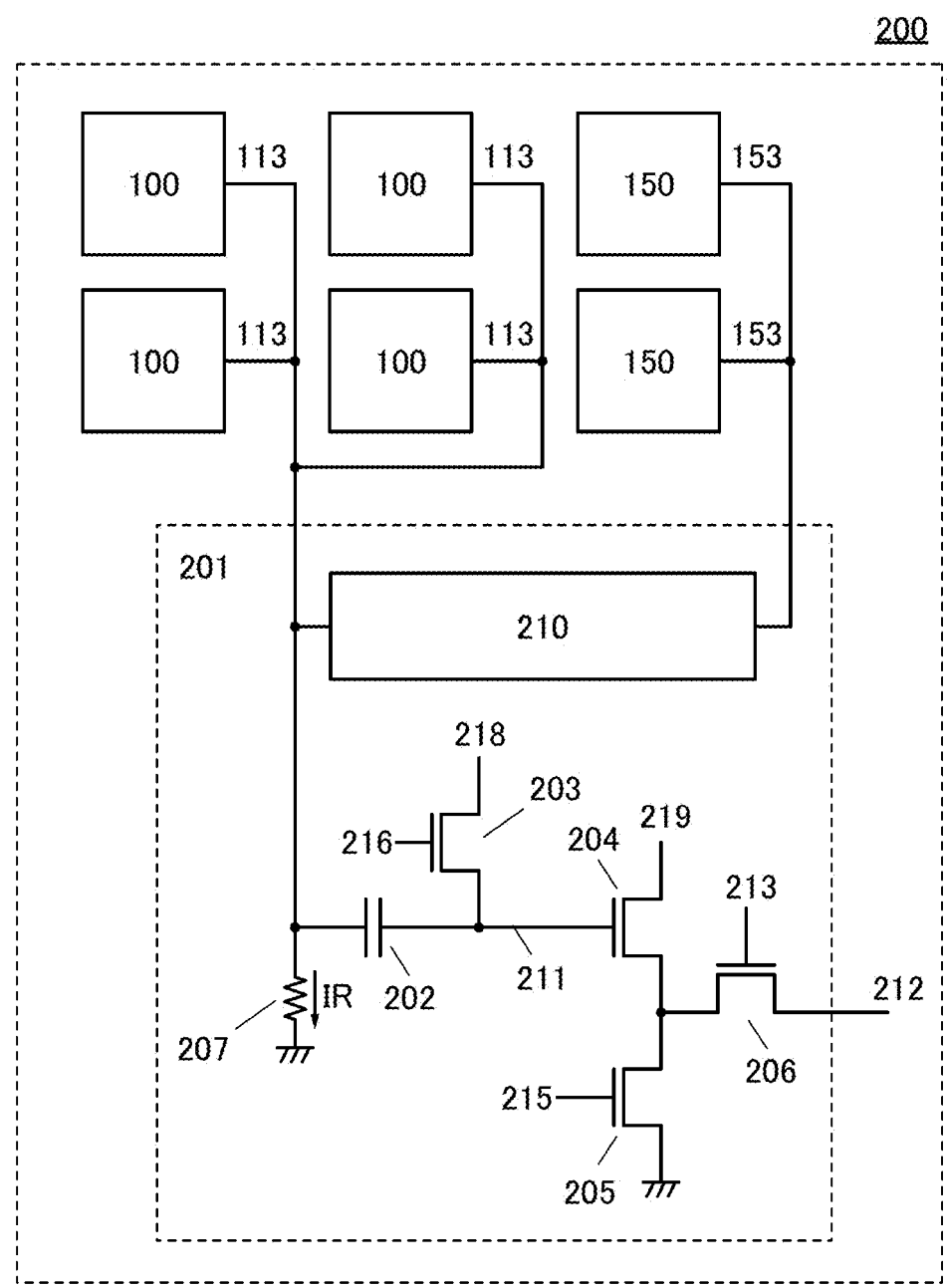
FIG. 2 A diagram illustrating a pixel block 200.

The pixel array 300 includes a plurality of pixel blocks 200. The pixel blocks 200 include a plurality of pixels arranged in a matrix and a circuit 201 as illustrated in FIG. 2.

Of the plurality of pixels, pixels in any one column are reference pixels 150, and the others are pixels 100. The pixels 100 can obtain image data, and the reference pixels 150 can output signals at the time of reset. Note that the number of pixels is 2×3 in an example illustrated in FIG. 2 but is not limited to this. It should be noted that the reference pixels are preferably provided for the number of rows.

The pixel blocks 200 operate as product-sum operation circuits, and the circuit 201 has a function of extracting the product of image data and weight coefficients from signals output from the pixels 100 and the reference pixels 150.

Figure 3:
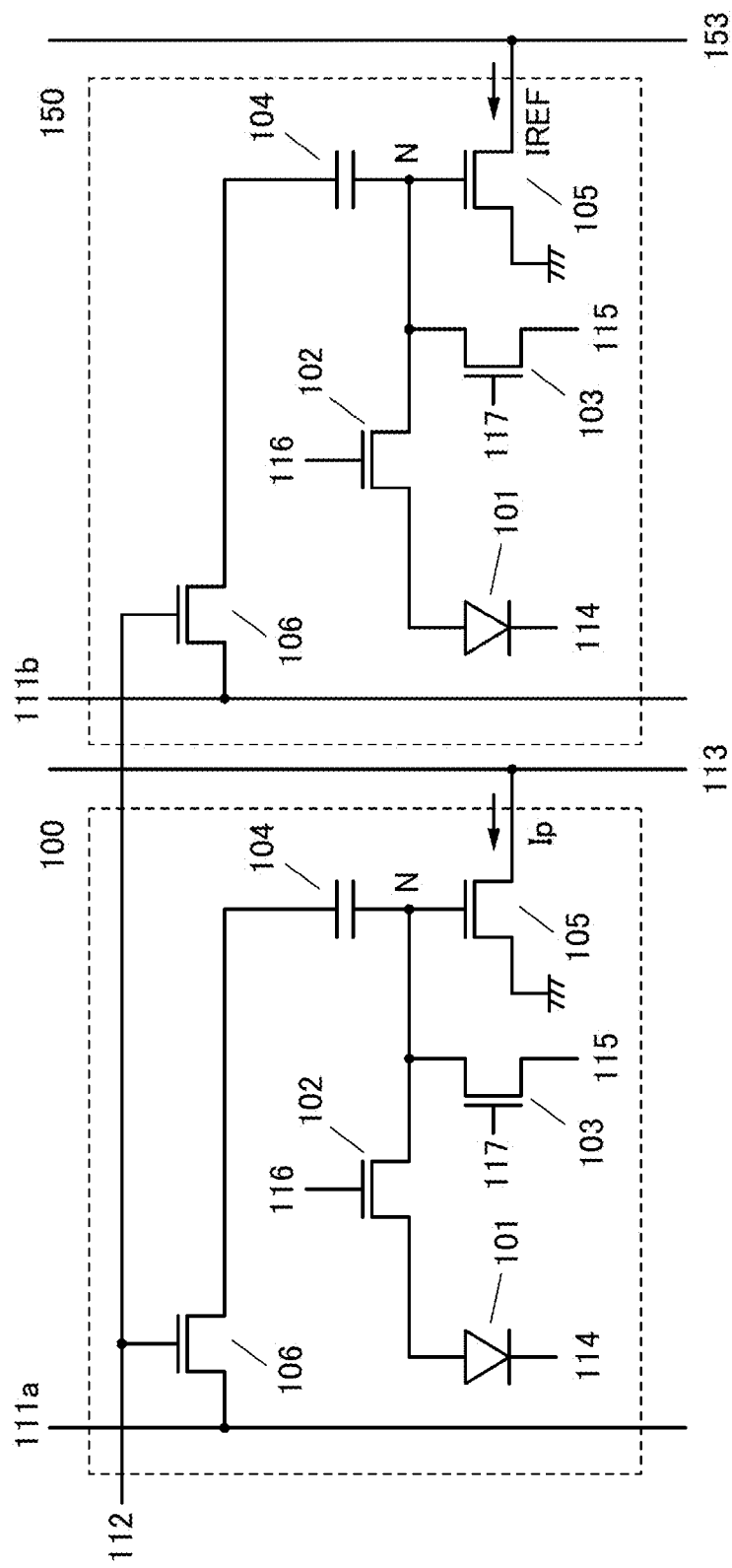
FIG. 3 A diagram illustrating a pixel 100 and a reference pixel 150.

As illustrated in FIG. 3, the pixel 100 can include a photoelectric conversion element 101, a transistor 102, a transistor 103, a capacitor 104, a transistor 105, and a transistor 106. Furthermore, the reference pixel 150 can also have an almost similar structure. The pixel 100 is mainly described below, and as for the reference pixel 150, only portions different from those of the pixel 100 are described.

One electrode of the photoelectric conversion element 101 is electrically connected to one of a source and a drain of the transistor 102. The other of the source and the drain of the transistor 102 is electrically connected to one of a source and a drain of the transistor 103. The one of the source and the drain of the transistor 103 is electrically connected to one electrode of the capacitor 104. The one electrode of the capacitor 104 is electrically connected to a gate of the transistor 105. The other electrode of the capacitor 104 is electrically connected to one of a source and a drain of the transistor 106.

The other electrode of the photoelectric conversion element 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. One of a source and a drain of the transistor 105 is electrically connected to a wiring 113. The other of the source and the drain of the transistor 105 is electrically connected to a GND wiring or the like. The other of the source and the drain of the transistor 106 is electrically connected to a wiring 111a. A gate of the transistor 106 is electrically connected to a wiring 112.

The reference pixel 150 is different from the pixel 100 in that the other of the source and the drain of the transistor 106 is electrically connected to a wiring 111b and that the one of the source and the drain of the transistor 105 is electrically connected to a wiring 153.

Here, an electrical connection point of the other of the source and the drain of the transistor 102, the one of the source and the drain of the transistor 103, the one electrode of the capacitor 104, and the gate of the transistor 105 is referred to a node N.

The wirings 114 and 115 can have a function of a power supply line. For example, the wiring 114 can function as a high potential power supply line, and the wiring 115 can function as a low potential power supply line. The wirings 112, 116, and 117 can function as signal lines which control the electrical conduction of the respective transistors. The wirings 111a and 111b can function as signal lines for supplying a potential corresponding to a weight coefficient to the pixels 100. The wiring 113 can function as a wiring for electrically connecting the pixel 100 and the circuit 201. The wiring 153 can function as a wiring for electrically connecting the reference pixel 150 and the circuit 201.

Note that an amplifier circuit or a gain control circuit may be electrically connected to the wiring 113.

As the photoelectric conversion element 101, a photodiode can be used. In order to increase the light detection sensitivity under low illuminance conditions, an avalanche photodiode is preferably used.

Figure 4A:
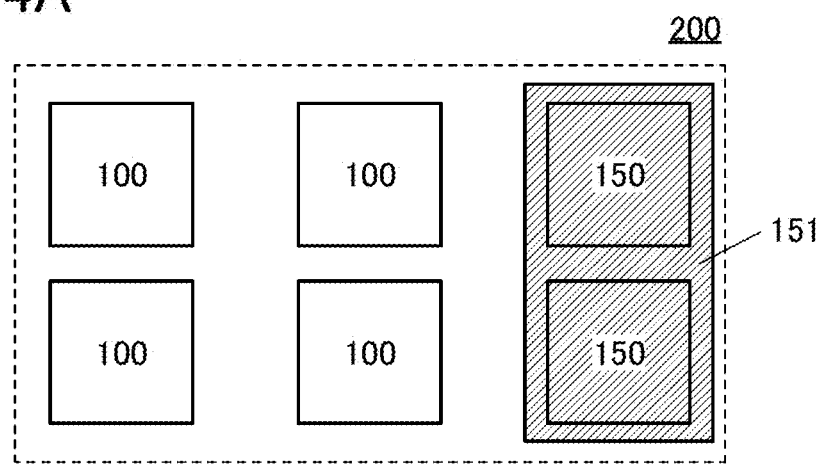
FIGS. 4A and 4B Diagrams illustrating reference pixels 150.
Figure 4B:
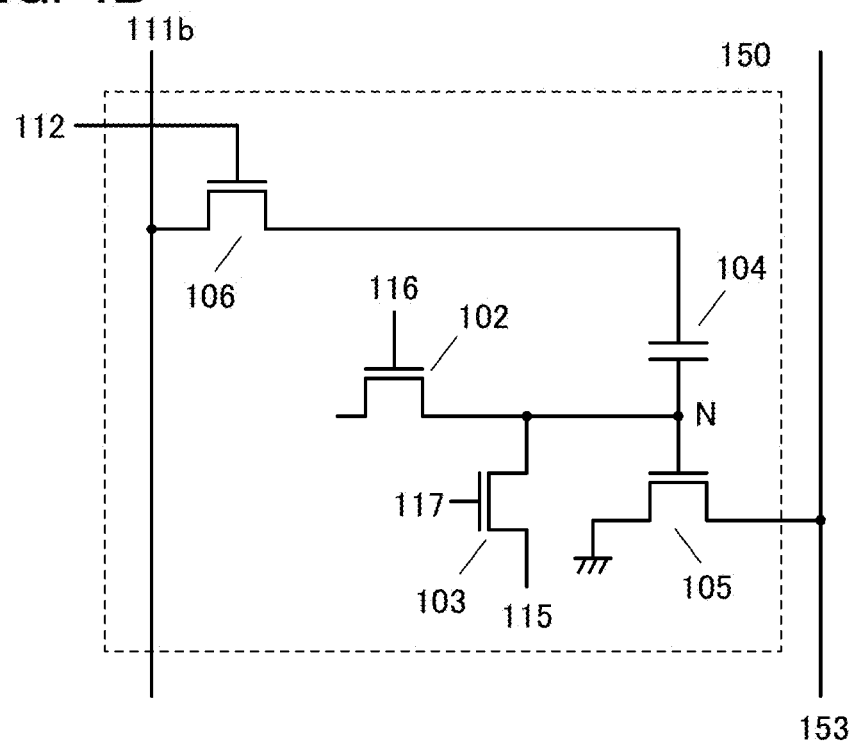

Since signal generation is conducted without a contribution of the photoelectric conversion element 101 in the reference pixels 150, a light-shielding layer 151 is preferably provided over the reference pixels 150 as illustrated in FIG. 4(A). Alternatively, as illustrated in FIG. 4(B), a structure not provided with the photoelectric conversion element 101 may be employed. Alternatively, the structure illustrated in FIG. 3 may be used in the state where the transistor 103 keeps being electrically conducted (reset state).

The transistor 102 can have a function of controlling the potential of the node N. The transistor 103 can have a function of initializing the potential of the node N. The transistor 105 can have a function of controlling a current fed by the circuit 201 depending on the potential of the node N. The transistor 106 can have a function of supplying a potential corresponding to a weight coefficient to the node N.

In the case where an avalanche photodiode is used as the photoelectric conversion element 101, a high voltage needs to be applied and transistors which withstand a high voltage are preferably used as the transistors connected to the photoelectric conversion element 101. As the transistors which withstand a high voltage, transistors including a metal oxide in channel formation regions (hereinafter referred to as OS transistors) or the like can be used, for example. Specifically, OS transistors are preferably used as the transistor 102 and the transistor 103.

Moreover, the OS transistors also have features of an extremely low off-state current. When OS transistors are used as the transistors 102 and 103, the charge retention period at the node N can be elongated greatly. Therefore, a global shutter system in which a charge accumulation operation is performed in all the pixels at the same time can be used without complicating the circuit configuration and operation method. Furthermore, while image data is retained at the node N, calculation using the image data can be performed a plurality of times.

It is desired that the transistor 105 have excellent amplifying characteristics. The transistor 106 is preferably a transistor having a high mobility capable of high-speed operation because the transistor 106 is repeatedly turned on and off at frequent intervals. Accordingly, transistors using silicon in their channel formation regions (hereinafter, Si transistors) are preferably used as the transistors 105 and 106.

Note that without limitation to the above, an OS transistor and a Si transistor may be freely used in combination. Furthermore, all the transistors may be either OS transistors or Si transistors.

The potential of the node N in the pixel 100 is determined by capacitive coupling between a potential obtained by adding a reset potential and a potential (image data) generated by photoelectric conversion by the photoelectric conversion element 101 and the potential corresponding to a weight coefficient supplied from the wiring 111a. That is, a signal output by the transistor 105 includes the product of the image data and the given weight coefficient.

The potential of the node N in the reference pixel 150 is determined by capacitive coupling between a reset potential supplied from the wiring 115 and the potential corresponding to a weight coefficient supplied from the wiring 111b.

As illustrated in FIG. 2, the pixels 100 are electrically connected to each other by the wiring 113, and the reference pixels 150 are electrically connected to each other by the wiring 153. Thus, the circuit 201 performs calculation with the use of a sum of signals output by the transistors 105 of the pixels 100 and a sum of signals output by the transistors 105 of the reference pixels 150.

The circuit 201 includes a current source circuit 210, a capacitor 202, a transistor 203, a transistor 204, a transistor 205, a transistor 206, and a resistor 207.

The current source circuit 210 is electrically connected to one electrode of the capacitor 202. The other electrode of the capacitor 202 is electrically connected to one of a source and a drain of the transistor 203. The other of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One electrode of the resistor 207 is electrically connected to the one electrode of the capacitor 202.

The current source circuit 210 is electrically connected to the wiring 113 and the wiring 153. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other electrode of the resistor 207 is electrically connected to a reference power supply line such as a GND wiring.

The wiring 219 can have a function of a power supply line. For example, the wiring 219 can function as a high potential power supply line. The wiring 218 can have a function of a wiring for supplying a potential dedicated to reading. The wirings 213, 214, 215, and 216 can function as signal lines which control the electrical conduction of the respective transistors.

The transistor 203 can have a function of resetting the potential of the wiring 211 to a potential of the wiring 218. The transistors 204 and 205 can function as source follower circuits. The transistor 206 can have a function of selecting the pixel block 200.

Figure 5A:
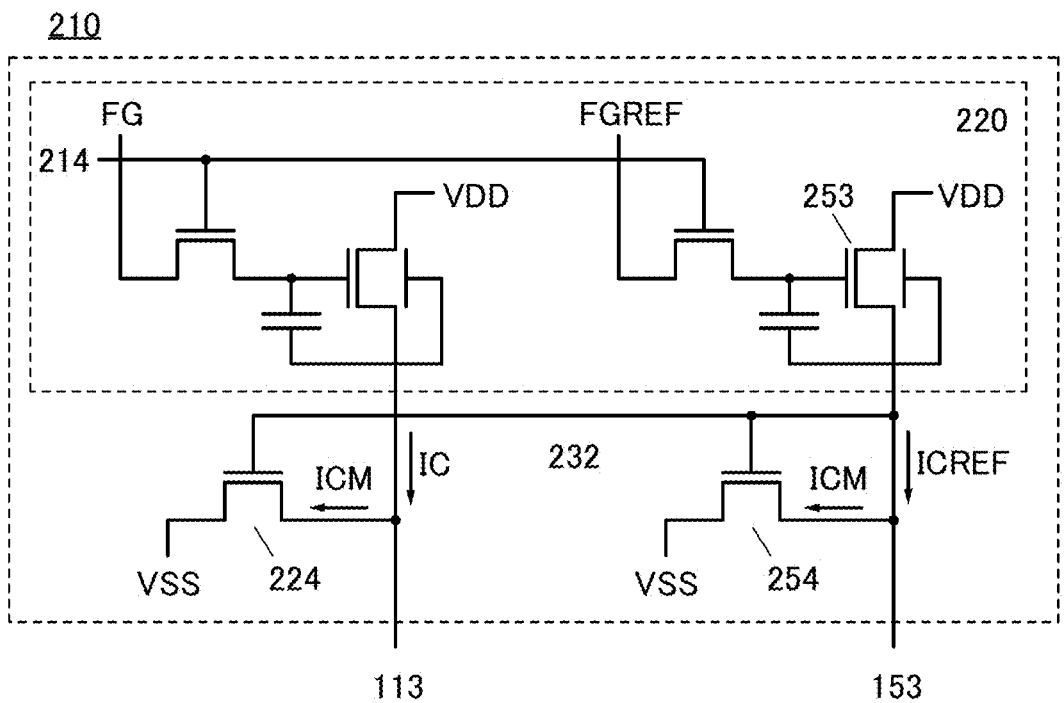
FIGS. 5A and 5B Diagrams illustrating a current supply circuit 210.

The current source circuit 210 can have a structure illustrated in FIG. 5(A), for example. The structure of FIG. 5(A) uses n-channel transistors, where the output side of a transistor 253 is electrically connected to a gate of a transistor 254, a drain of the transistor 254, and a gate of a transistor 224. With this structure, the transistor 254 and the transistor 224 operate as a current mirror circuit. Arbitrary signal potentials are supplied to signal lines FG and FGREF, and when the wiring 214 is at "H", a constant current can be supplied to the wiring 113 and the wiring 153. As the transistors in this structure, either or both of OS transistors and Si transistors can be used.

Figure 5B:
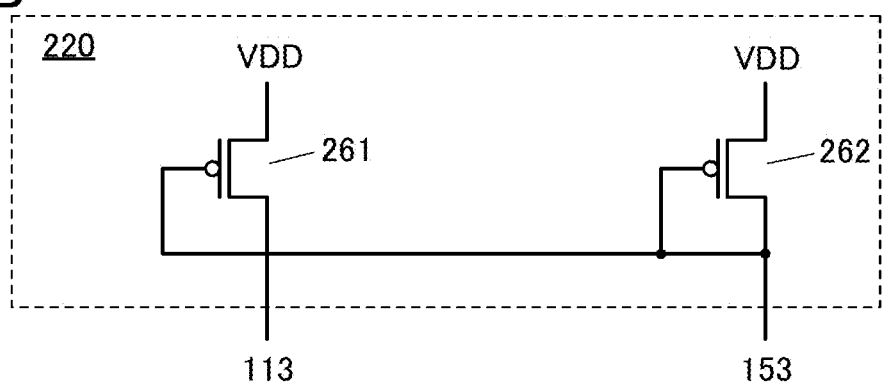

Note that a circuit 220 included in the current source circuit 210 may have a structure using p-channel transistors as illustrated in FIG. 5(B), where the output side of a transistor 262 is electrically connected to a gate of the transistor 262 and a gate of a transistor 261. In this structure, Si transistors are preferably used as the transistors 261 and 262.

The circuit 201 can eliminate offset components other than the product of image data (potential X) and a weight coefficient (potential W) and extract the objective WX. The following is a WX extraction process in the case of using the circuit illustrated in FIG. 5(A) as the current source circuit 210.

First, in the circuit 201, the transistor 203 is brought into a conduction state so that a potential Vr is written from the wiring 218 to a wiring 211. Here, the potential Vr is a reference potential used for a reading operation.

At this time, it is assumed that the potential X is written to the node N of the pixel 100 by photoelectric conversion. In addition, weight coefficients written from the wirings 111a and 111b are assumed to be 0.

Accordingly, the sum of currents (IREF) which flow through the reference pixels 150 becomes $k\Sigma(0-V_{th})^2$. Here, k is a constant and $V_{th}$ is the threshold voltage of the transistor 105.

A current $ICM_0$ (ICM when the weight is 0) which flows through the current source circuit 210 is represented as follows: $ICM_0=ICREF_0$ (ICREF when the weight is 0)$-k\Sigma(0-V_{th})^2$.

The sum of currents (Ip) which flow through the pixels 100 becomes $k\Sigma(X-V_{th})^2$.

A current $IR_0$ (IR when the weight is 0) which flows through the resistor 207 is represented as follows: $IR_0=IC-ICM_0-k\Sigma(X-V_{th})^2$. This means $IR_0=IC-ICREF_0+k\Sigma(0-V_{th})^2-k\Sigma(X-V_{th})^2$.

Then, the transistor 203 is brought into a non-conduction state, so that the potential Vr is retained in the wiring 211. After that, weight coefficients W are written to the pixels 100 and the reference pixels 150 from the wirings 111a and 111b.

At this time, the sum of currents (IREF) which flow through the reference pixels 150 is $k\Sigma(W-V_{th})^2$.

The sum of currents (Ip) which flow through the pixels 100 is $k\Sigma(W+X-V_{th})^2$.

The current IR which flows through the resistor 207 is represented as follows: $IR=IC-ICM-k\Sigma(W+X-V_{th})^2$. This means $IR=IC-ICREF+k\Sigma(W-V_{th})^2-k\Sigma(W+X-V_{th})^2$.

Here, the difference between $IR_0$ and IR is represented as follows: $IR_0-IR=k\Sigma(V_{th}^2-(X-V_{th})^2-(W-V_{th})^2+(W+X-V_{th})^2)=k\Sigma(2WX)$. Thus, offset components are eliminated and a term consisting of WX can be extracted.

When the current flowing through the resistor 207 is $IR_0$, the potential Vr is retained in the wiring 211. By subsequently changing the current which flows through the resistor 207 to IR, the difference is added to the wiring 211 owing to capacitive coupling of the capacitor 202. In other words, the sum of Vr that is a known reference potential and the potential having a WX component becomes a gate potential of the transistor 204. By turning on the transistor 206, a signal from which offset components are eliminated can be output to the wiring 212.

Figure 6:
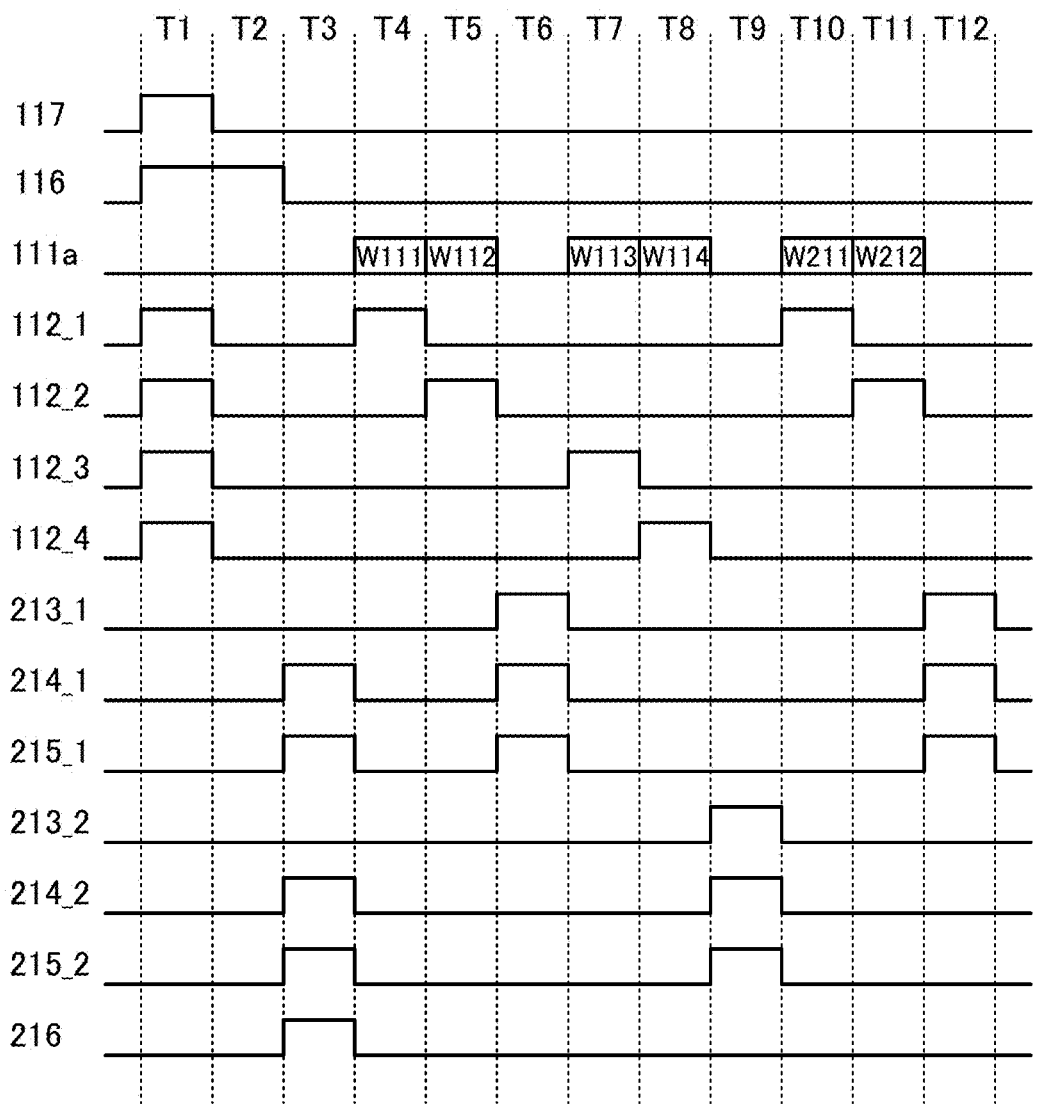
FIG. 6 A timing chart illustrating an operation of the pixel block 200.

FIG. 6 is a timing chart illustrating an operation of the pixel block 200. For convenience, the timings of changing the signals are matched in the chart; however, in reality, the timings are preferably shifted in consideration of the delay inside the circuit.

First, in a period T1, the potential of the wiring 117 is brought to "H" and the potential of the wiring 116 is brought to "H", so that the nodes N in the pixels 100 and the reference pixels 150 have reset potentials. Furthermore, the potentials of the wirings 111 are brought to "L" and wirings 112_1 to 112_4 (corresponding to the wirings 112 in the first to fourth rows) are brought to "H", so that weight coefficients 0 are written.

The potential of the wiring 116 is kept at "H" in the period T2, so that the potential X (image data) is written to the nodes N by photoelectric conversion in the photoelectric conversion element 101.

In a period T3, a wiring 214_1 (the wiring 214 in the first row), a wiring 215_1 (the wiring 215 in the first row), a wiring 214_2 (the wiring 214 in the second row), a wiring 215_2 (the wiring 215 in the second row), and the wiring 216 are brought to "H", so that the potential Vr is written to the wiring 211.

In a period T4, the potential of the wiring 111 is set at a potential corresponding to a weight coefficient W111, and the potential of the wiring 112_1 is set at "H", so that the weight coefficient W111 is written to the node N of the pixel 100 in the first row.

In a period T5, the potential of the wiring 111 is set at a potential corresponding to a weight coefficient W112, and the potential of the wiring 112_2 is set at "H", so that the weight coefficient W112 is written to the node N of the pixel 100 in the second row.

In a period T6, a wiring 213_1 (the wiring 213 in the first row), the wiring 214_1, and the wiring 215_1 are brought to "H", so that a signal from which offset components are eliminated is output from the circuit 201 of the pixel block 200 in the first row.

Then, the operation similar to the above is repeated, and a signal obtained by multiplying the pixels 100 of the pixel block 200 in the second row by certain weight coefficients is output in periods T7, T8, and T9. Furthermore, in periods T10, T11, and T12, a signal obtained by multiplying the pixel 100 of the pixel block 200 in the first row by weight coefficients different from those in T4 and T5 is output.

Figure 7A:
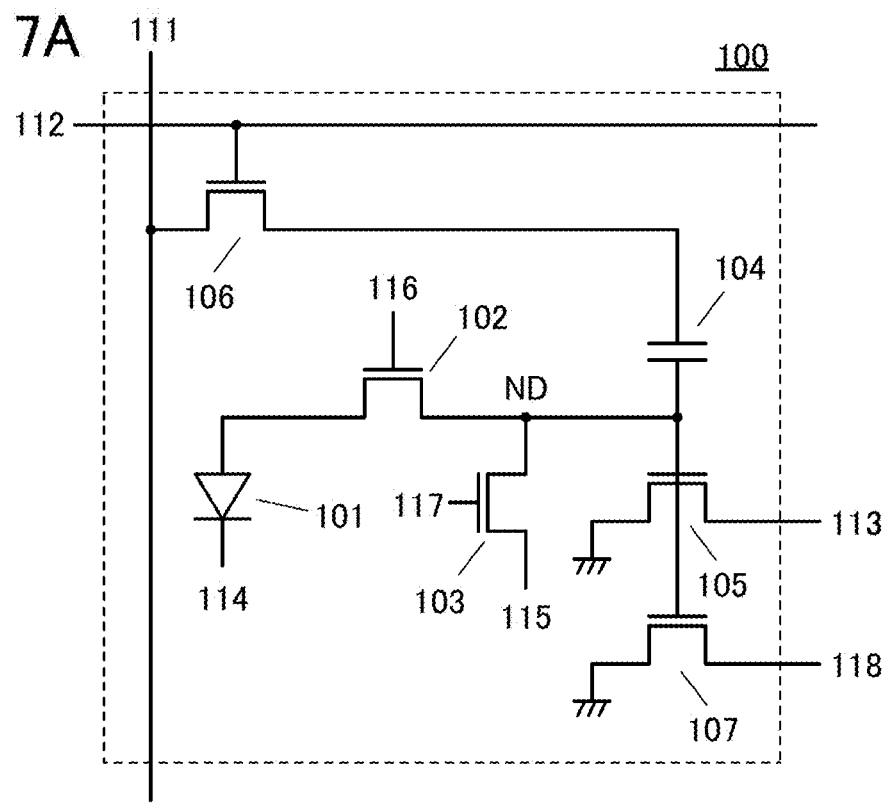
FIGS. 7A and 7B Diagrams illustrating a pixel 100 and pixel blocks 200.

Note that the adjacent pixel blocks 200 may share the pixel 100. For example, a transistor 107 capable of producing output in a manner similar to that of the transistor 105 is provided in the pixel 100 as illustrated in FIG. 7(A). A gate of the transistor 107 is electrically connected to the transistor 105, and one of a source and a drain thereof is electrically connected to a wiring 118.

Figure 7B:
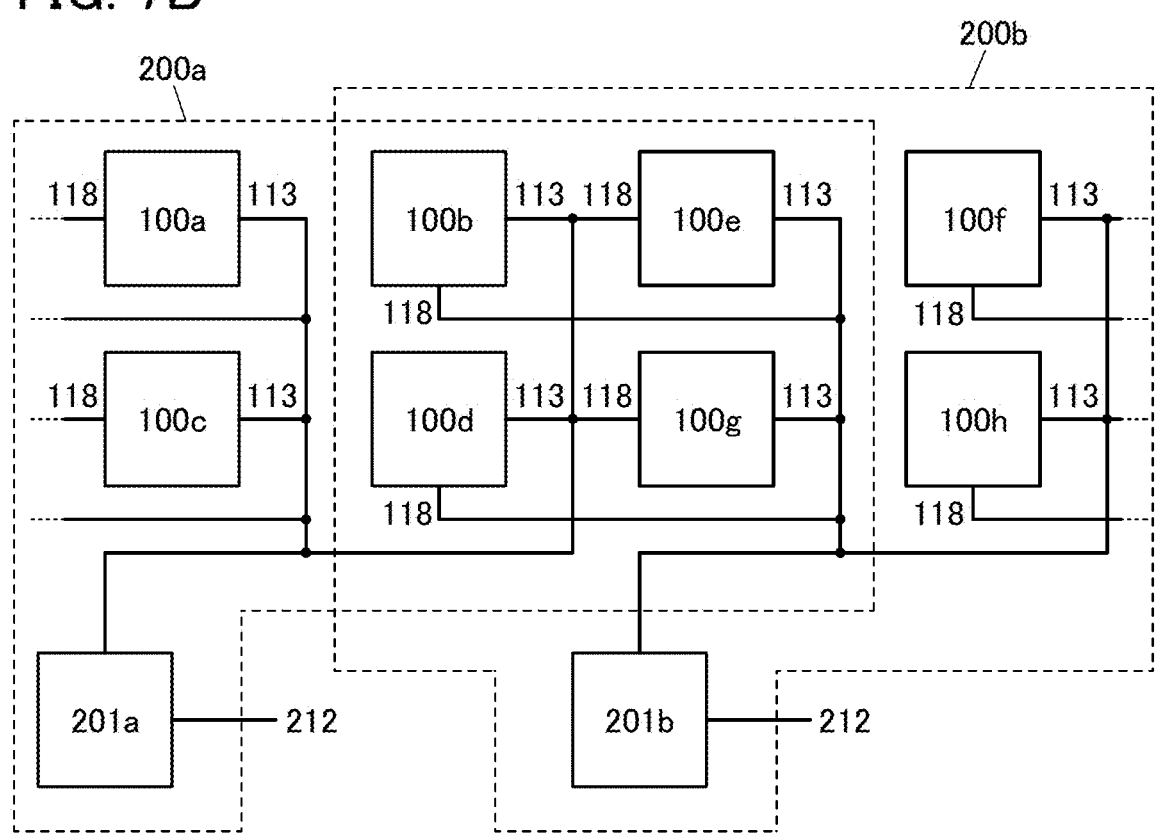

The wiring 118 is utilized for electrical connection to the circuit 201 in the adjacent pixel block. FIG. 7(B) illustrates a form of connection between the pixels 100 (pixels 100a, 100b, 100c, 100d, 100e, 100f, 100g, and 100h) and the circuits 201 (circuits 201a and 201b) in the adjacent pixel blocks 200 (pixel blocks 200a and 200b). Note that the reference pixels 150 are not illustrated in FIG. 7(B).

In the pixel block 200a, the pixels 100a, 100b, 100c, and 100d are electrically connected to the circuit 201a through the wiring 113. Furthermore, the pixels 100e and 100g are electrically connected to the circuit 201a through the wiring 118.

In the pixel block 200b, the pixels 100e, 100f, 100g, and 100h are electrically connected to the circuit 201b through the wiring 113. Furthermore, the pixels 100b and 100d are electrically connected to the circuit 201b through the wiring 118.

That is, the pixel block 200a and the pixel block 200b share the pixels 100b, 100d, 100e, and 100g. With this form, a network between the pixel blocks 200 can be dense, improving the accuracy of image analysis and the like.

The weight coefficient can be output from the circuit 305 illustrated in FIG. 1 to the wiring 111, and it is preferable to rewrite the weight coefficient more than once in a frame period. As the circuit 305, a decoder can be used. The circuit 305 may include a D/A converter or an SRAM. The selection of a pixel to which a weight coefficient is input is performed by the output of a signal from the circuit 304 to the wiring 112. The circuit 304 may be a decoder or a shift register.

Furthermore, the circuit 303 can output a signal to the wirings 213, 215, 216, and the like connected to the transistors of the circuit 201. As the circuit 303, a decoder or a shift register can be used.

Figure 8A:
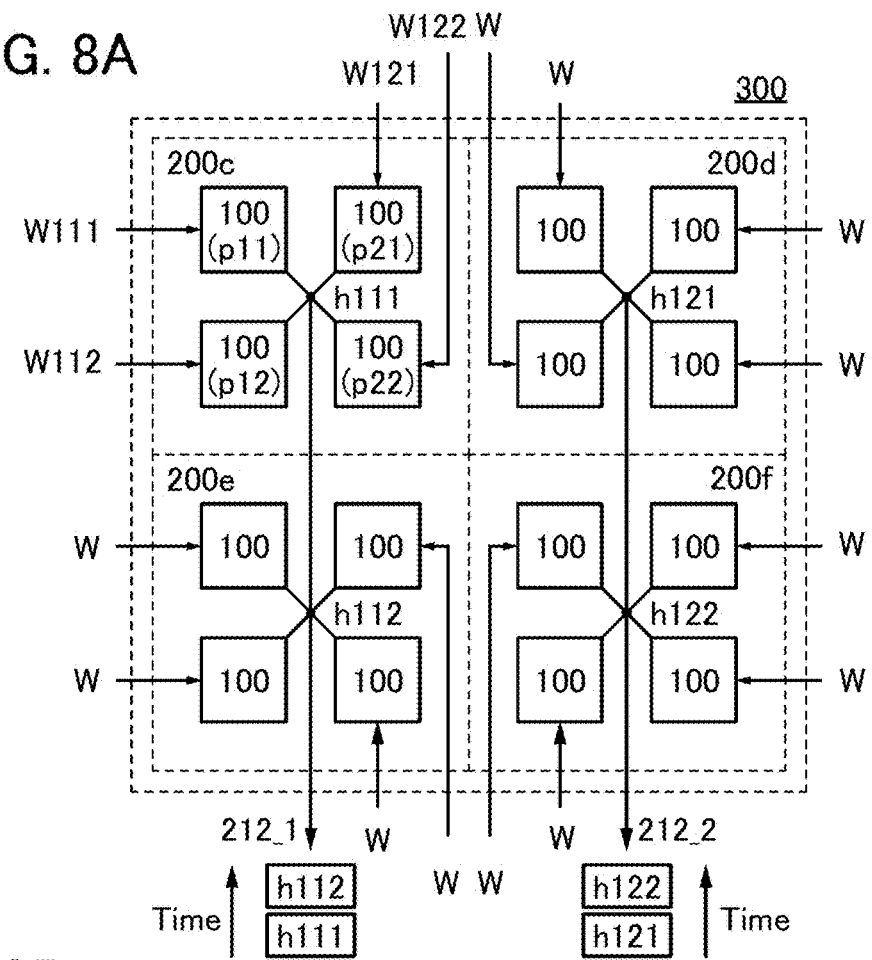
FIGS. 8A and 8B Diagrams explaining signals output by the pixel blocks 200 and signals output by a circuit 302.

FIG. 8(A) is a diagram explaining signals output by the pixel blocks 200. For simple description, FIG. 8(A) illustrates an example where the pixel array 300 consists of four pixel blocks 200 (a pixel block 200c, a pixel block 200d, a pixel block 200e, and a pixel block 200f) and each of the pixel blocks 200 includes four pixels 100.

Signal generation will be described taking the pixel block 200c as an example, but the pixel blocks 200d, 200e, and 200f can output signals through similar operations.

In the pixel block 200c, the pixels 100 retain their respective image data p11, p12, p21, and p22 in the nodes N. Weight coefficients (W111, W112, W121, and W122) are input to the pixels 100, and h111 which is a product-sum operation result is output to the wiring 212_1 (the wiring 212 in the first column). Here, h111=p11×W111+p12×W112+p21×W12+p22×W122. Note that the weight coefficients are not limited to being all different from each other, and the same value might be input to some of the pixels 100.

Concurrently through a process similar to the above, a product-sum operation result h121 is output from the pixel block 200d to the wiring 212_2 (the wiring 212 in the second column); thus, the output of the pixel blocks 200 in the first row is completed.

Subsequently, in the pixel blocks 200 in the second row, through a process similar to the above, a product-sum operation result h112 is output from the pixel block 200e to the wiring 212_1. Concurrently, a product-sum operation result h122 is output from the pixel block 200f to the wiring 212_2; thus, the output of the pixel blocks 200 in the second row is completed.

Moreover, weight coefficients are changed in the pixel blocks 200 in the first row and a process similar to the above is performed, so that h211 and h221 can be output. Furthermore, weight coefficients are changed in the pixel blocks 200 in the second row and a process similar to the above is performed, so that h212 and h222 can be output. The above operation is repeated as necessary.

Figure 8B:
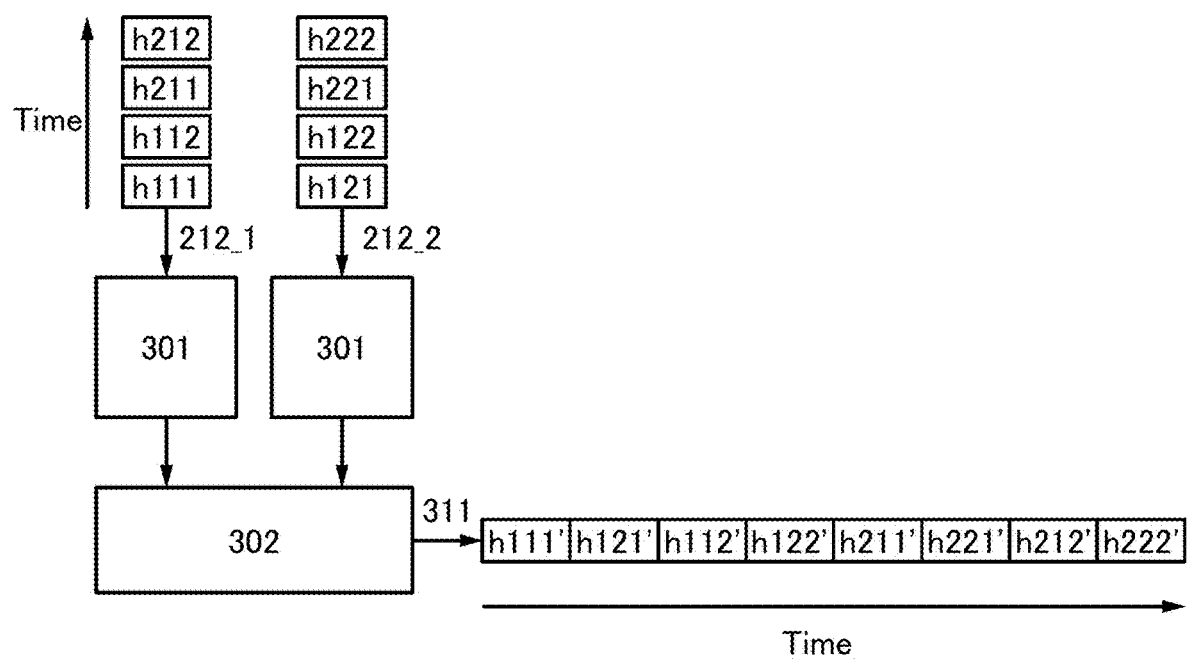

Product-sum operation result data output to the wirings 212_1 and 212_2 are sequentially input to the circuits 301 as illustrated in FIG. 8(B). The circuits 301 are circuits which perform calculation of an activation function and can be, for example, comparator circuits. A comparator circuit outputs a result of comparing input data and a set threshold as binary data. In other words, the pixel blocks 200 and the circuits 301 can operate as part of elements in a neural network.

Furthermore, from the fact that the data output by the pixel blocks 200 correspond to image data of a plurality of bits and are binarized by the circuits 301, the binarization can be rephrased as compression of image data.

The data binarized by the circuits 301 (h111', h121', h112', h122', h211', h221', h212', and h222') are sequentially input to the circuit 302.

The circuit 302 can have a structure including a latch circuit, a shift register, and the like, for example. With this structure, parallel serial conversion is possible, and data input in parallel may be output to a wiring 311 as serial data, as illustrated in FIG. 8(B). The connection destination of the wiring 311 is not limited. For example, it can be connected to a neural network, a memory device, a communication device, or the like.

Figure 9:
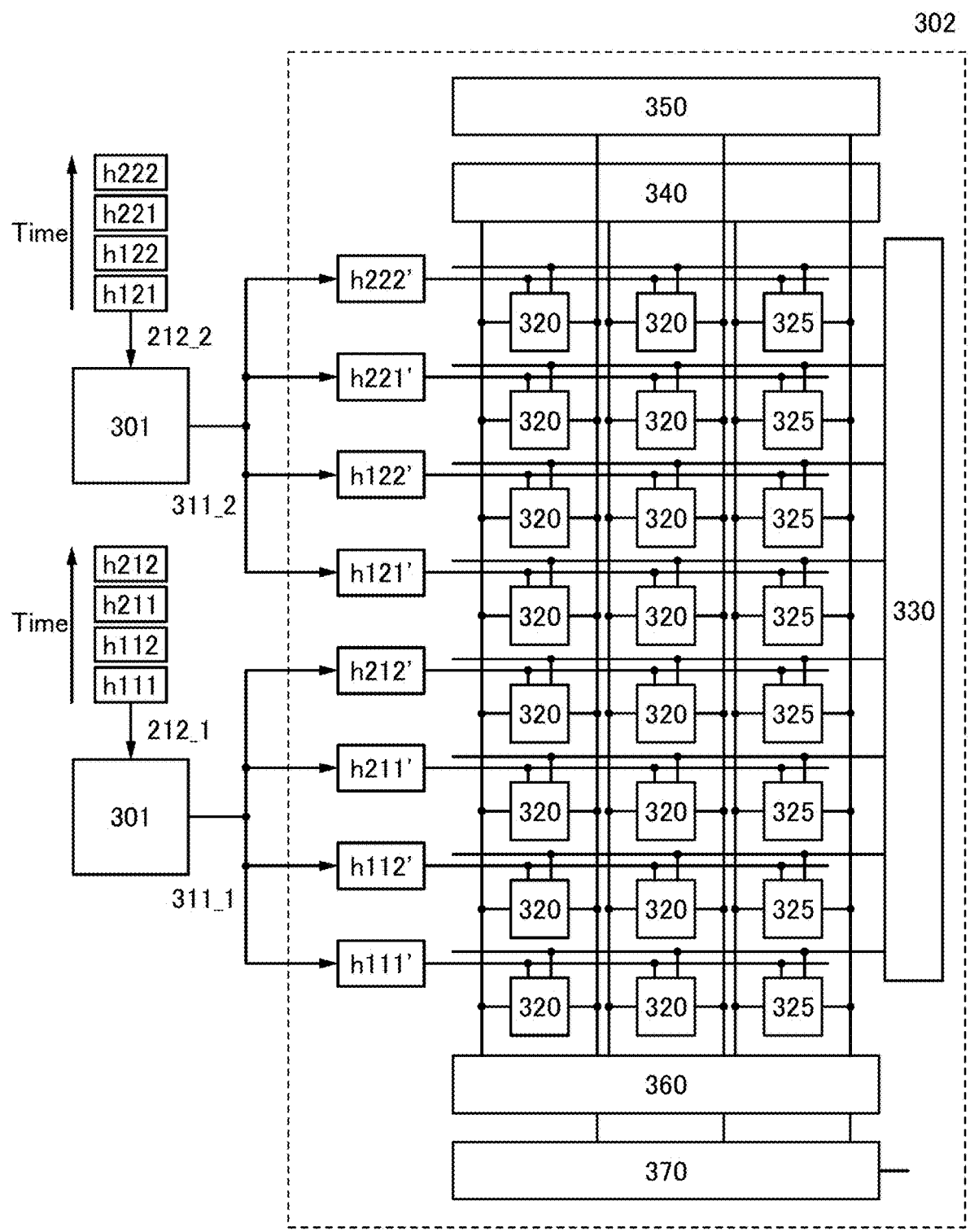
FIG. 9 A diagram illustrating the circuit 302 (neural network).

Moreover, as illustrated in FIG. 9, the circuit 302 may include a neural network. The neural network includes memory cells arranged in a matrix, and each memory cell retains a weight coefficient. Data output by the circuit 301 are input to the cells in the row direction, and the product-sum operation in the column direction can be performed. Note that the number of memory cells illustrated in FIG. 9 is an example, and the number is not limited.

The neural network illustrated in FIG. 9 includes memory cells 320 and reference memory cells 325 which are arranged in a matrix, a circuit 340, a circuit 350, a circuit 360, the circuit 360, and a circuit 370.

Figure 10:
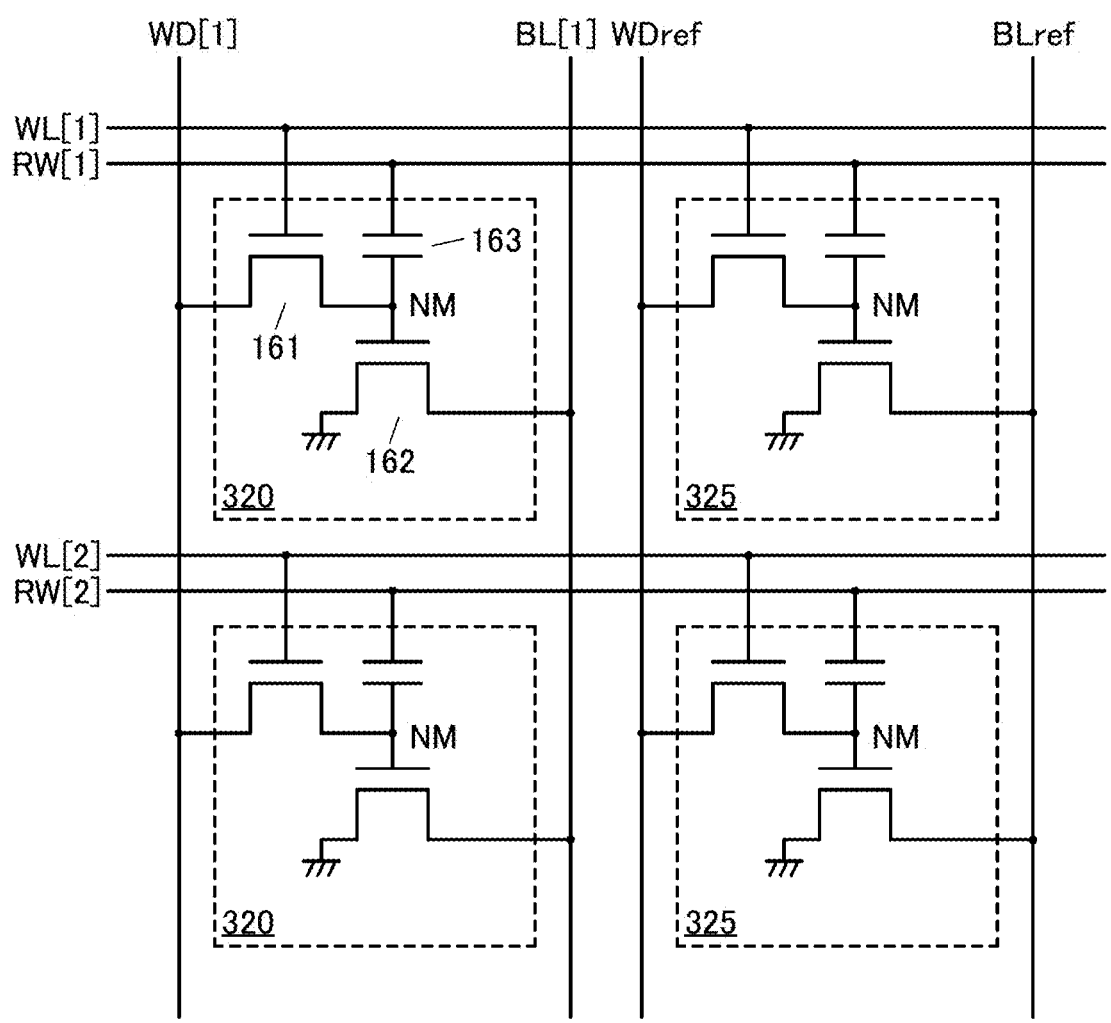
FIG. 10 A diagram illustrating pixels included in the circuit 302.

FIG. 10 illustrates an example of the memory cells 320 and the reference memory cells 325. The reference memory cells 325 are provided in any one column. The memory cells 320 and the reference memory cells 325 have similar structures and include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point at which the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cells 320, the other of the source and the drain of the transistor 161 is electrically connected to a wiring WD. The other of the source and the drain of the transistor 162 is electrically connected to a wiring BL.

In the reference memory cells 325, the other of the source and the drain of the transistor 161 is electrically connected to a wiring WDref. The other of the source and the drain of the transistor 162 is electrically connected to a wiring BLref.

The wiring WL is electrically connected to a circuit 330. As the circuit 330, a decoder, a shift register, or the like can be used.

The wiring RW is electrically connected to the circuit 301. Binary data output from the circuit 301 to a wiring 311_1 or a wiring 311_2 is written to each memory cell.

The wiring WD and the wiring WDref are electrically connected to the circuit 340. As the circuit 340, a decoder, a shift register, or the like can be used. Furthermore, the circuit 340 may include a D/A converter or an SRAM. The circuit 340 can output a weight coefficient to be written to the node NM.

The wiring BL and the wiring BLref are electrically connected to the circuit 350 and the circuit 360. The circuit 350 is a power supply circuit and can have a structure equivalent to that of the current source circuit 210. The circuit 360 can have a structure equivalent to that of the circuit 201 from which the current source circuit 210 is eliminated. By the circuit 350 and the circuit 360, a signal of a product-sum operation result from which offset components are eliminated can be obtained.

The circuit 360 is electrically connected to the circuit 370. The circuit 370 can have a structure equivalent to that of the circuit 301 and also be referred to as an activation function circuit. The activation function circuit has a function of performing calculation for converting the signal input from the circuit 360 in accordance with a predefined activation function. As the activation function, a sigmoid function, a tanh function, a softmax function, a ReLU function, a threshold function, or the like can be used, for example. The signal converted by the activation function circuit is output to the outside as output data.

Figure 11A:
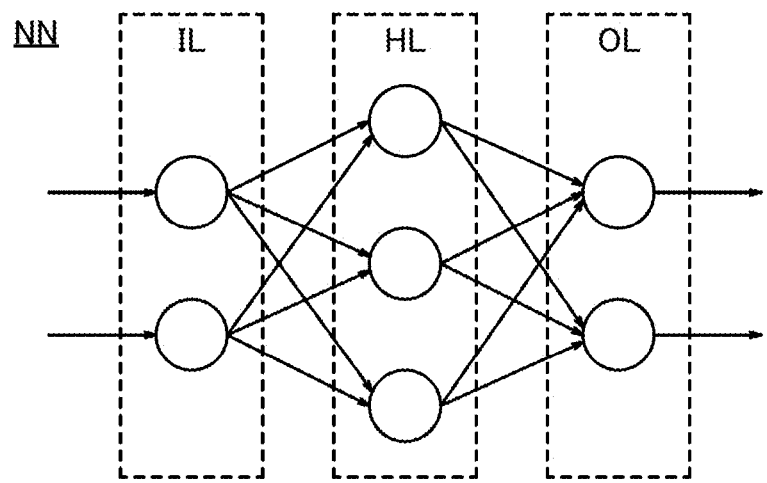
FIGS. 11A and 11B Diagrams illustrating a structure example of a neural network.

As illustrated in FIG. 11(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. An output signal of a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 11B:
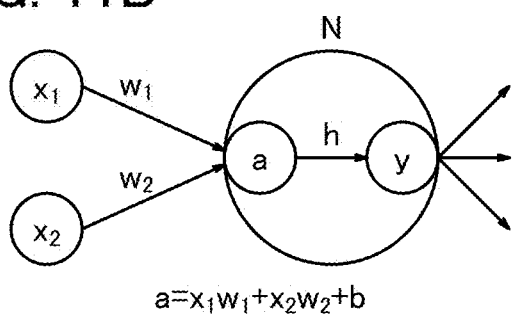

FIG. 11(B) illustrates an example of calculation by a neuron. Here, a neuron N and two neurons in the previous layer which output signals to the neuron N are shown. An output $x_1$ of the neuron in the previous layer and an output $x_2$ of the neuron in the previous layer are input to the neuron N. Then, in the neuron N, a total sum $x_1w_1+x_2w_2$ of the product of the output $x_1$ and a weight $w_1$ ($x_1w_1$) and the product of the output $x_2$ and a weight $w_2$ ($x_2w_2$) is calculated, and then a bias b is added as necessary, so that a value $a=x_1w_1+x_2w_2+b$ is obtained. Then, the value a is converted with an activation function h, and an output signal $y=h(a+b)$ is output from the neuron N.

In this manner, the calculation by the neurons includes the calculation that sums the products of the outputs and the weights of the neurons in the previous layer, that is, the product-sum operation ($x_1w_1+x_2w_2$ described above). This product-sum operation may be performed using a program on software or using hardware.

In one embodiment of the present invention, an analog circuit is used as hardware to perform a product-sum operation. When an analog circuit is used as the product-sum operation circuit, the circuit scale of the product-sum operation circuit can be reduced, or higher processing speed and lower power consumption can be achieved owing to reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may include both a Si transistor and an OS transistor.

Although the processing of the captured image data in the imaging device of one embodiment of the present invention has been described above, the image data can also be extracted without processing.

For example, although the sum of the data p11, p12, p21, and p22 is output in the pixel block 200c of FIG. 8(A) according to the above description, any one of the pixels 100 can be multiplied by the weight coefficient 1 and the other the pixels 100 can be multiplied by the weight coefficient 0, so that image data of one pixel 100 can be extracted. Furthermore, by sequentially selecting the pixels 100 where the weight coefficient is 1, image data can be extracted from all the pixels 100.

As mentioned in the description of the process of extracting WX from the circuit 201, calculating a difference between $IR_0$ and IR can extract the term consisting of WX. Here, in the case where the weight coefficient is 0, signals output from the pixels 100 are canceled out; thus, a signals of only the pixels 100 where the weight coefficient is 1 can be obtained. Note that if the resolution permits, the weight coefficient in all the pixels 100 may be 1 and the image data may be extracted.

Figure 12A:
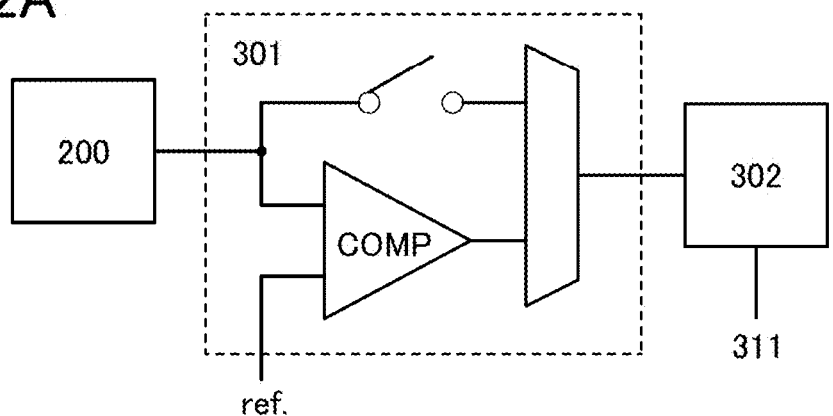
FIGS. 12A-12C Diagrams illustrating a circuit 301 and the pixel 100.

At this time, the circuits 301 preferably have a structure as illustrated in FIG. 12(A) where a comparator and a switch are connected in parallel and the outputs thereof can be selected. In the case of image processing, a signal output by the pixel block 200 is input to the comparator, and a binarized signal is output to the circuit 302. In the case of obtaining image data, a signal output by the pixel block 200 is output to the circuit 302 through a path on which the switch stands. At this time, the circuit 302 may be provided with an A/D converter.

Figure 12B:
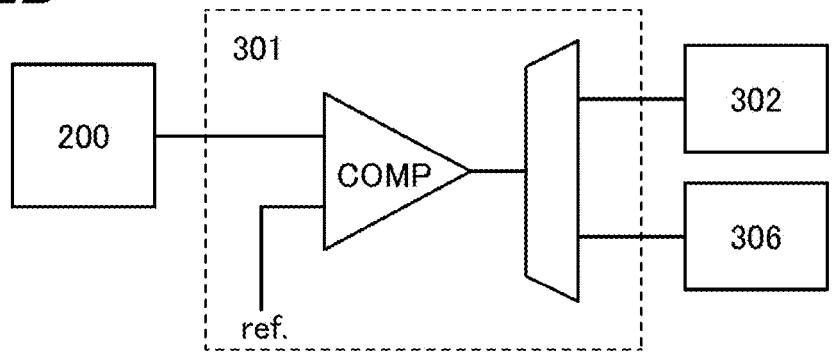

Alternatively, as illustrated in FIG. 12(B), the circuit 301 may consist of a comparator and a selection circuit, and the output may head for the circuit 302 or a circuit 306. A counter circuit can be used as the circuit 306. The comparator and the counter circuit can form an A/D converter. Note that the circuit 306 may be provided in the circuit 302.

Figure 12C:
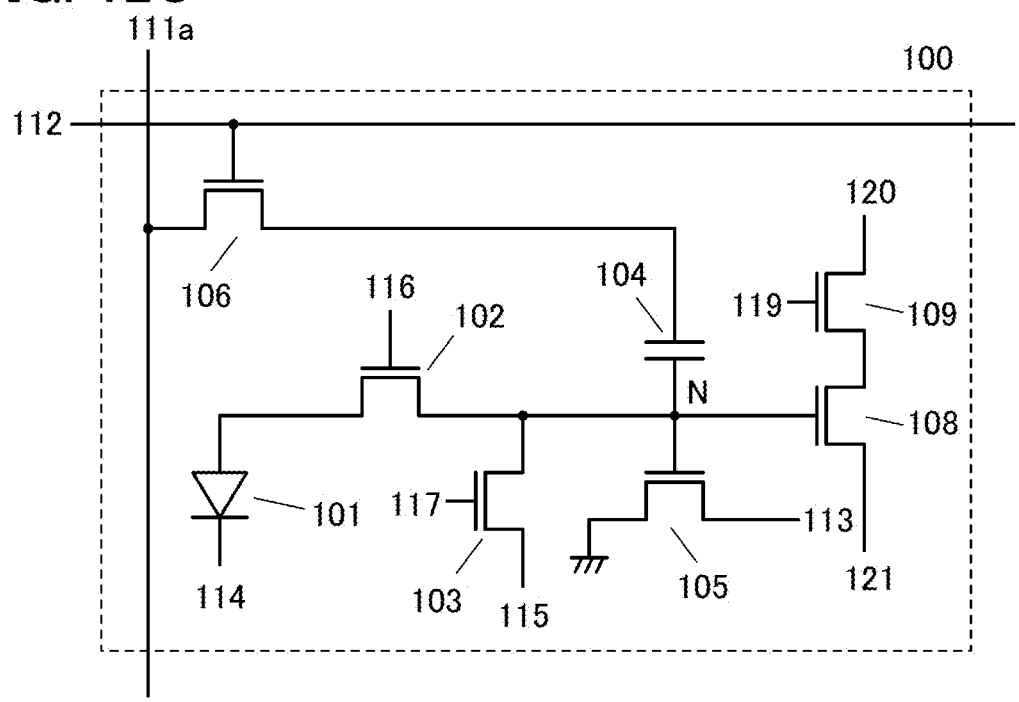

Alternatively, as illustrated in FIG. 12(C), the pixel 100 may have a structure provided with a transistor 108 and a transistor 109. The transistor 108 can have a function of outputting a signal (image data) corresponding to the potential of the node N. The transistor 109 can have a function of selecting the pixel 100.

A gate of the transistor 108 is electrically connected to one electrode of the capacitor 104. One of a source and a drain of the transistor 108 is electrically connected to one of a source and a drain of the transistor 109. The other of the source and the drain of the transistor 108 is electrically connected to a wiring 121. A gate of the transistor 109 is electrically connected to a wiring 119. The other of the source and the drain of the transistor 109 is electrically connected to a wiring 120.

The wiring 119 can have a function of a signal line which controls the electrical conduction of the transistor 109. The wiring 120 can have a function of an output line. The wiring 121 can have a function of a power supply line and can be, for example, a high potential power supply line.

The wiring 120 can be electrically connected to a correlated double sampling circuit (CDS circuit) and an A/D converter. Alternatively, the wiring 120 may have a structure of being electrically connected to the wiring 113 through a switch. In this case, the output of the transistor 105 and the output of the transistor 108 can be selectively input to the circuit 201. In the case where the output of the transistor 108 is selected, formation of the circuit 301 with the structures illustrated in FIGS. 12(A) and 12(B) enables obtainment of image data.

This embodiment can be combined with the description of the other embodiments as appropriate.

Embodiment 2

In this embodiment, structure examples and the like of the imaging device of one embodiment of the present invention are described.

Figure 13A:
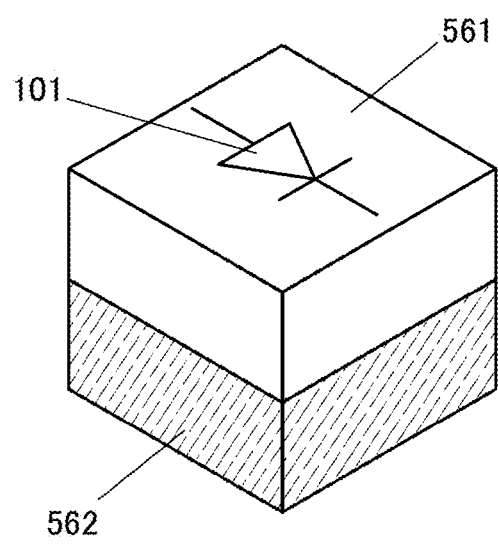
FIGS. 13A-13D Diagrams illustrating structures of a pixel in an imaging device.

FIG. 13(A) illustrates a structure example of a pixel included in the imaging device. The pixel illustrated in FIG. 13(A) is an example having a stacked-layer structure of a layer 561 and a layer 62.

The layer 561 includes the photoelectric conversion element 101. As illustrated in FIG. 13(C), the photoelectric conversion element 101 can be a stacked layer of a layer 565a, a layer 565b, and a layer 565c.

The photoelectric conversion element 101 illustrated in FIG. 13(C) is a pn-junction photodiode; for example, a $p^+$-type semiconductor, an n-type semiconductor, and an $n^+$-type semiconductor can be used for the layer 565a, the layer 565b, and the layer 565c, respectively. Alternatively, an $n^+$-type semiconductor, a p-type semiconductor, and a $p^+$-type semiconductor may be used for the layer 565a, the layer 565b, and the layer 565c, respectively. Alternatively, a pin-junction photodiode in which the layer 565b is an i-type semiconductor may be used.

The above-described pn-junction photodiode or pin-junction photodiode can be formed using single crystal silicon. Furthermore, the pin-junction photodiode can also be formed using a thin film of amorphous silicon, microcrystalline silicon, polycrystalline silicon, or the like.

Figure 13B:
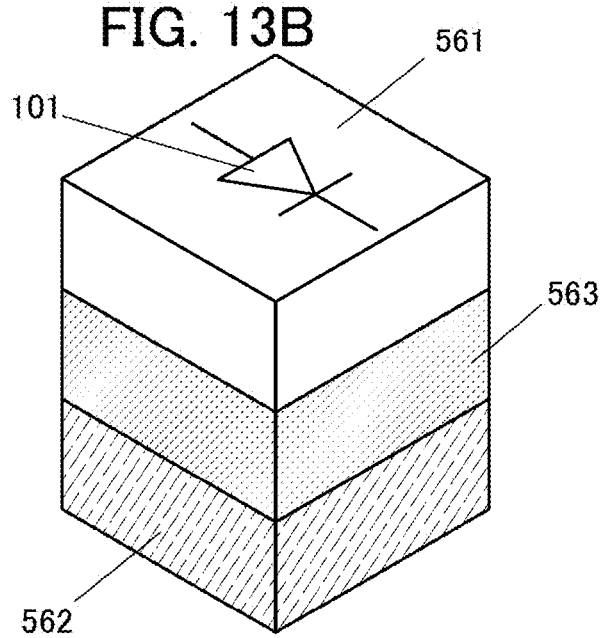
Figure 13C:
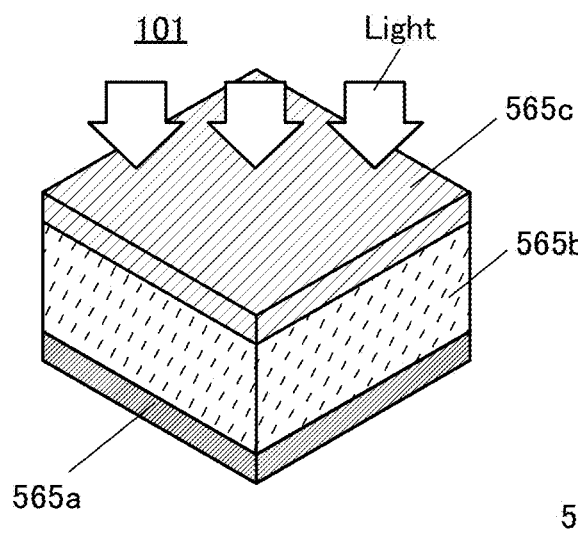
Figure 13D:
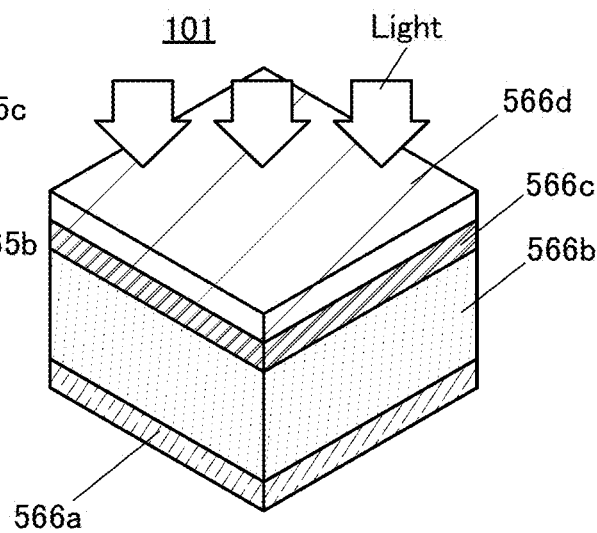

The photoelectric conversion element 101 included in the layer 561 may be a stacked layer of a layer 566a, a layer 566b, a layer 566c, and a layer 566d as illustrated in FIG. 13(D). The photoelectric conversion element 101 illustrated in FIG. 13(D) is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

As the layer 566d, a conductive layer having a high visible light-transmitting property is preferably used. For example, indium oxide, tin oxide, zinc oxide, indium tin oxide, gallium zinc oxide, indium gallium zinc oxide, graphene, or the like can be used. Note that the layer 566d can be omitted.

The layers 566b and 566c of the photoelectric conversion portion can have, for example, a structure of a pn-junction photodiode with a selenium-based material for a photoelectric conversion layer. A selenium-based material, which is a p-type semiconductor, is preferably used for the layer 566b, and gallium oxide or the like, which is an n-type semiconductor, is preferably used for the layer 566c.

The photoelectric conversion element with a selenium-based material has a property of high external quantum efficiency with respect to visible light. In the photoelectric conversion element, the amount of amplification of electrons with respect to the amount of incident light can be increased by utilizing the avalanche multiplication. A selenium-based material has a high light-absorption coefficient, and thus has advantages in production; for example, a photoelectric conversion layer can be fabricated as a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed with a material having a wide band gap and a visible light-transmitting property. For example, zinc oxide, gallium oxide, indium oxide, tin oxide, or a mixed oxide thereof can be used. In addition, these materials also have a function of a hole injection blocking layer, and a dark current can be decreased.

As the layer 562 illustrated in FIG. 13(A), a silicon substrate can be used, for example. The silicon substrate includes a Si transistor or the like. Using the Si transistor, not only a pixel circuit but also a circuit for driving the pixel circuit, a circuit for reading an image signal, an image processing circuit, and the like can be provided. Specifically, part or all of the transistors included in the peripheral circuits (such as the pixels 100 and the reference pixels 150, the circuit 201, and the circuits 301 to 305) described in Embodiment 1 can be provided in the layer 562.

Furthermore, the pixel may have a stacked-layer structure of the layer 561, a layer 563, and the layer 562 as illustrated in FIG. 13(B).

The layer 563 can include OS transistors (for example, the transistors 102 and 103 of the pixel 100). In that case, the layer 562 preferably includes Si transistors (for example, the transistors 105 and 106 of the pixel 100). Furthermore, part of the transistors included in the peripheral circuits described in Embodiment 1 may be provided in the layer 563.

With such a structure, components of the pixel circuit and the peripheral circuits can be dispersed in a plurality of layers and the components can be provided to overlap with each other or any of the component and any of the peripheral circuits can be provided to overlap with each other, whereby the area of the imaging device can be reduced. Note that in the structure of FIG. 13(B), the layer 562 may be a support substrate, and the pixels 100 and the peripheral circuits may be provided in the layer 561 and the layer 563.

As a semiconductor material used for the OS transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

The semiconductor layer can be, for example, a film represented by an In—M—Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that forms the semiconductor layer is an In—M—Zn-based oxide, it is preferable that the atomic ratio of the metal elements of a sputtering target used to deposit the In—M—Zn oxide satisfy In≥M and Zn≥M. The atomic ratio of metal elements of such a sputtering target is preferably, for example, In:M:Zn=1:1:1, In:M:Zn=1:1:1.2, In:M:Zn=3:1:2, In:M:Z=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratios of metal elements of the sputtering targets in a range of ±40%.

An oxide semiconductor with low carrier density is used as the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

However, the composition is not limited to those, and a material having the appropriate composition may be used depending on required semiconductor characteristics and electrical characteristics of the transistor (field-effect mobility, threshold voltage, or the like). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to be appropriate.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (concentration measured by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor including an oxide semiconductor which contains nitrogen is likely to have normally-on characteristics. Hence, the concentration of nitrogen (concentration measured by secondary ion mass spectrometry) is preferably set to lower than or equal to $5\times10^{18}$ atoms/$cm^3$.

The semiconductor layer may have a non-single-crystal structure, for example. Examples of the non-single-crystal structure include a CAAC-OS including a c-axis aligned crystal (C-Axis Aligned Crystalline Oxide Semiconductor or C-Axis Aligned and A-B-plane Anchored Crystalline Oxide Semiconductor), a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

Meanwhile, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where $GaO_{X3}$ is a main component and the region where $In_{X2}Zn_{Y2}O_{Z2}$ or $InO_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other and form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through the regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

Moreover, a semiconductor element using the CAC-OS has high reliability. Thus, the CAC-OS is suitable as a constituent material in a variety of semiconductor devices.

Figure 14A:
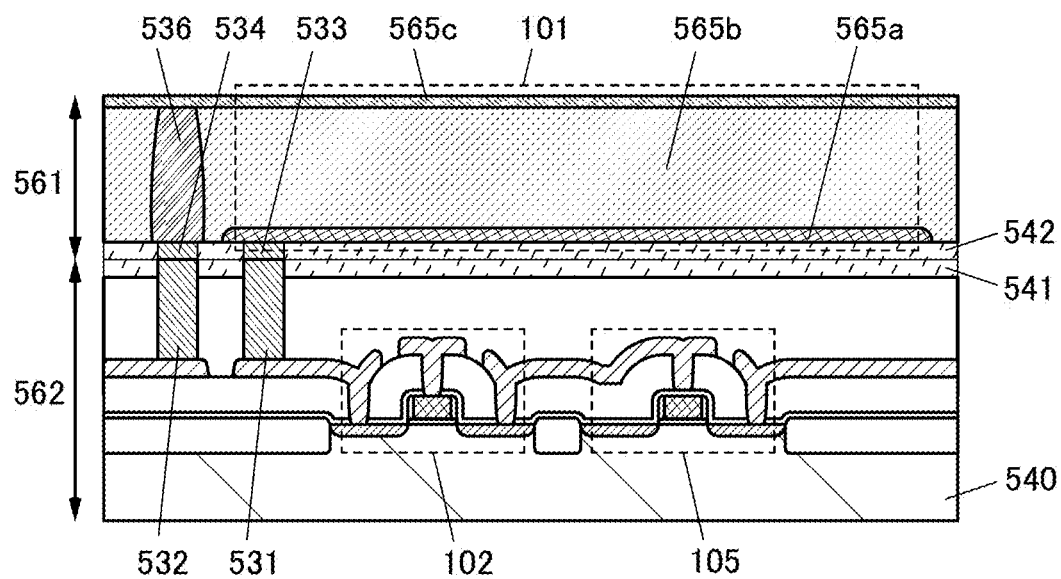
FIGS. 14A and 14B Diagrams illustrating structures of a pixel in an imaging device.

FIG. 14(A) is a diagram illustrating an example of a cross section of the pixel illustrated in FIG. 13(A). The layer 561 includes a pn-junction photodiode with silicon for a photoelectric conversion layer, as the photoelectric conversion element 101. The layer 562 includes a Si transistor, and FIG. 14(A) illustrates the transistors 102 and 105 included in the pixel circuit as an example.

In the photoelectric conversion element 101, the layer 565a can be a $p^+$-type region, the layer 565b can be an n-type region, and the layer 565c can be an $n^+$-type region. In the layer 565b, a region 536 for connection between a power supply line and the layer 565c is provided. For example, the region 536 can be a $p^+$-type region.

Figure 16A:
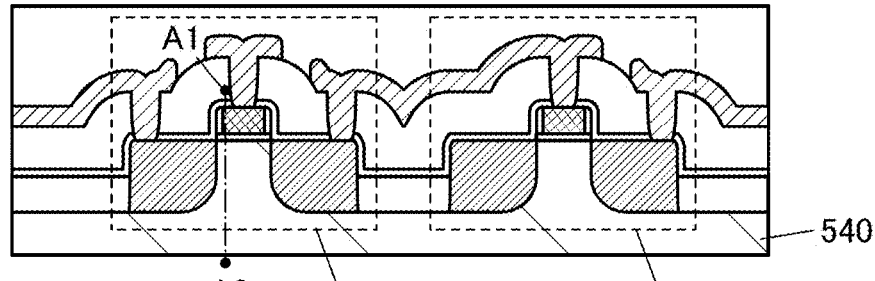
FIGS. 16A-16E Diagrams illustrating structures of a pixel in an imaging device.
Figure 16B:
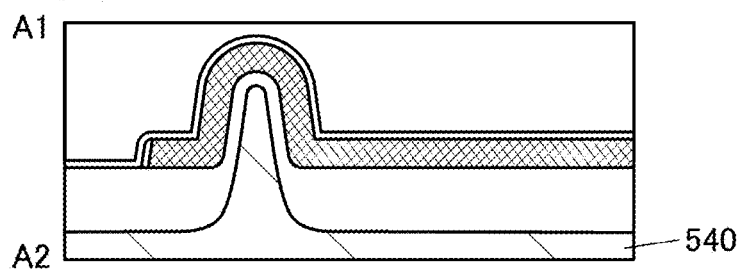

Although the Si transistor illustrated in FIG. 14(A) is of a planar type including a channel formation region in the silicon substrate 540, a structure including a fin semiconductor layer in the silicon substrate 540 as illustrated in FIGS. 16(A) and 16(B) may be employed. FIG. 16(A) corresponds to a cross section in the channel length direction and FIG. 16(B) corresponds to a cross section in the channel width direction.

Figure 16C:
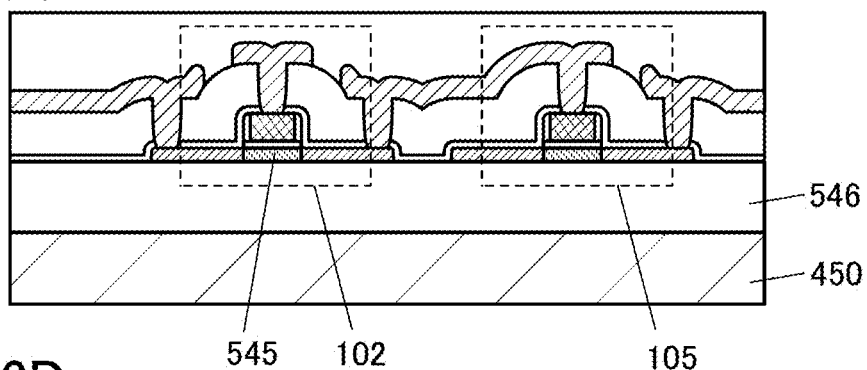

Alternatively, as illustrated in FIG. 16(C), transistors each including a semiconductor layer 545 of a silicon thin film may be used. The semiconductor layer 545 can be single crystal silicon (SOI (Silicon on Insulator)) formed on an insulating layer 546 on the silicon substrate 540, for example.

Here, FIG. 14(A) illustrates a structure example in which electrical connection between elements of the layer 561 and elements of the layer 562 is obtained by bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 536. Furthermore, surfaces of the insulating layer 542, the conductive layer 533, and the conductive layer 534 are planarized to be level with each other.

An insulating layer 541, a conductive layer 531, and a conductive layer 532 are provided in the layer 562. The conductive layer 531 and the conductive layer 532 each include a region embedded in the insulating layer 541. The conductive layer 531 is electrically connected to a power supply line. The conductive layer 532 is electrically connected to the source or the drain of the transistor 102. Furthermore, surfaces of the insulating layer 541, the conductive layer 531, and the conductive layer 532 are planarized to be level with each other.

Here, main components of the conductive layer 531 and the conductive layer 533 are preferably the same metal element. Main components of the conductive layer 532 and the conductive layer 534 are preferably the same metal element. Furthermore, the insulating layer 541 and the insulating layer 542 are preferably formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal element described above is preferably used for a combination of the conductive layer 531 and the conductive layer 533 and the same metal element described above is preferably used for a combination of the conductive layer 532 and the conductive layer 534. Furthermore, the same insulating material described above is preferably used for the insulating layer 541 and the insulating layer 542. With this structure, bonding in which a boundary between the layer 561 and the layer 562 is a bonding position can be performed.

By the bonding, the electrical connection of each of the combination of the conductive layer 531 and the conductive layer 533 and the combination of the conductive layer 532 and the conductive layer 534 can be obtained. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are brought into contact to be bonded to each other temporarily, and then dehydrated by heat treatment to perform final bonding. The hydrophilic bonding method can also cause bonding at an atomic level; thus, mechanically excellent bonding can be achieved.

When the layer 561 and the layer 562 are bonded together, the insulating layers and the metal layers coexist on their bonding surfaces; therefore, the surface activated bonding method and the hydrophilic bonding method are performed in combination, for example.

For example, a method in which the surfaces are cleaned after polishing, the surfaces of the metal layers are subjected to antioxidant treatment and then hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 14B:
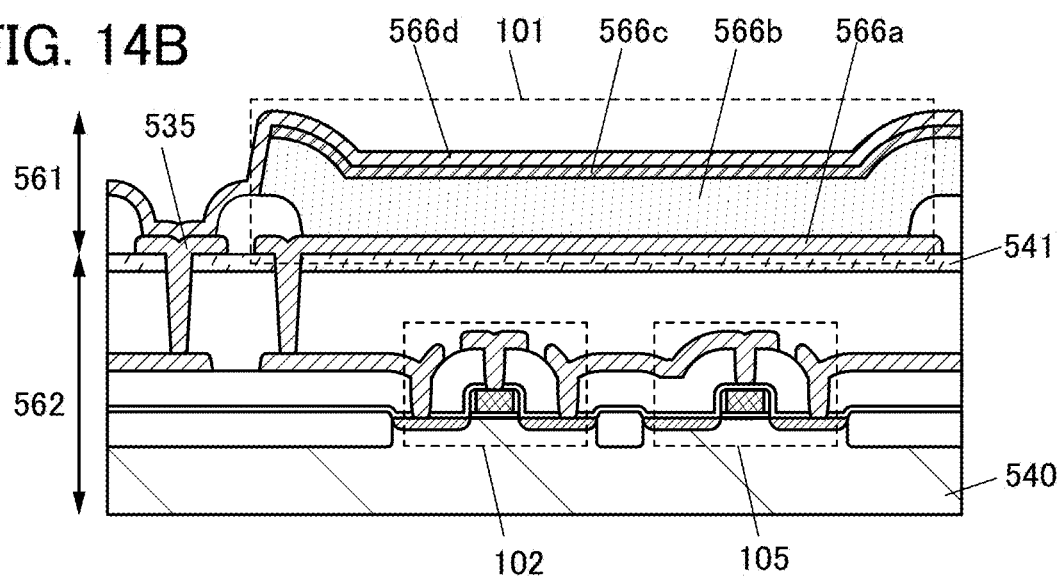

FIG. 14(B) is a cross-sectional view of the case where a pn-junction photodiode with a selenium-based material for a photoelectric conversion layer is used for the layer 561 of the pixel illustrated in FIG. 13(A). The layer 566a is included as one electrode, the layers 566b and 566c are included as the photoelectric conversion layer, and the layer 566d is included as the other electrode.

In this case, the layer 561 can be directly formed on the layer 562. The layer 566a is electrically connected to the source or the drain of the transistor 102. The layer 566d is electrically connected to a power supply line through the region 536.

Figure 15A:
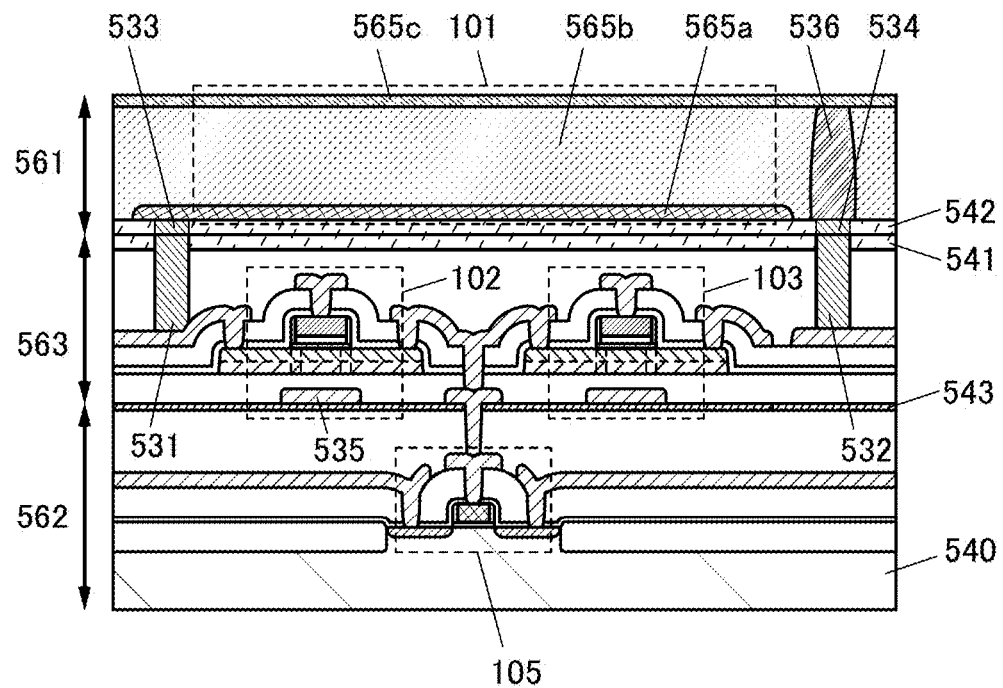
FIGS. 15A and 15B Diagrams illustrating structures of a pixel in an imaging device.

FIG. 15(A) is a diagram illustrating an example of a cross section of the pixel illustrated in FIG. 16(B). The layer 561 includes a pn-junction photodiode using silicon for a photoelectric conversion layer, as the photoelectric conversion element 101. The layer 562 includes a Si transistor, and FIG. 15(A) illustrates the transistor 105 included in the pixel circuit as an example. The layer 562 includes an OS transistor, and FIG. 15(A) illustrates the transistors 102 and 103 included in the pixel circuit as an example. A structure example is illustrated in which electrical connection between the layer 561 and the layer 563 is obtained by bonding.

Figure 16D:
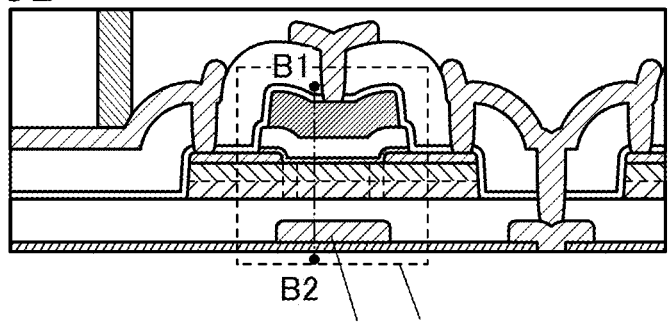

Although the OS transistor having a self-aligned structure is illustrated in FIG. 15(A), a non-self-aligned top-gate transistor may also be used as illustrated in FIG. 16(D).

Figure 16E:
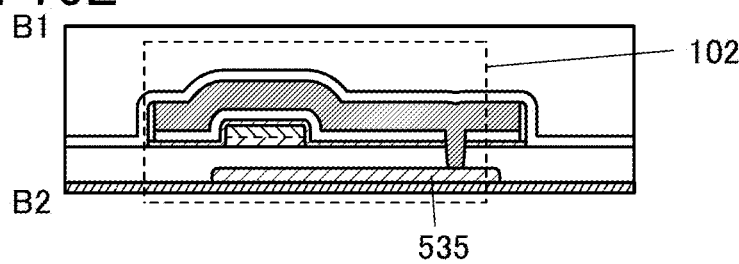

Although the transistors 102 and 103 include a back gate 535, a mode in which the back gate is not included may be employed. As illustrated in FIG. 16(E), the back gate 535 may be electrically connected to a front gate of the transistor, which is provided to face the back gate 535. Alternatively, a structure in which a fixed potential different from that for the front gate can be supplied to the back gate 535 may be employed.

An insulating layer 543 that has a function of inhibiting diffusion of hydrogen is provided between a region where an OS transistor is formed and a region where Si transistors are formed. Dangling bonds of silicon are terminated with hydrogen in insulating layers provided in the vicinity of a channel formation region of the transistor 105. Meanwhile, hydrogen in an insulating layer provided in the vicinity of channel formation regions of the transistors 102 and 103 is one of the factors generating carriers in the oxide semiconductor layer.

Hydrogen is confined in one layer by the insulating layer 543, so that the reliability of the transistor 105 can be improved. Furthermore, diffusion of hydrogen from the one layer to the other layer is inhibited, so that the reliability of the transistors 102 and 103 can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 15B:
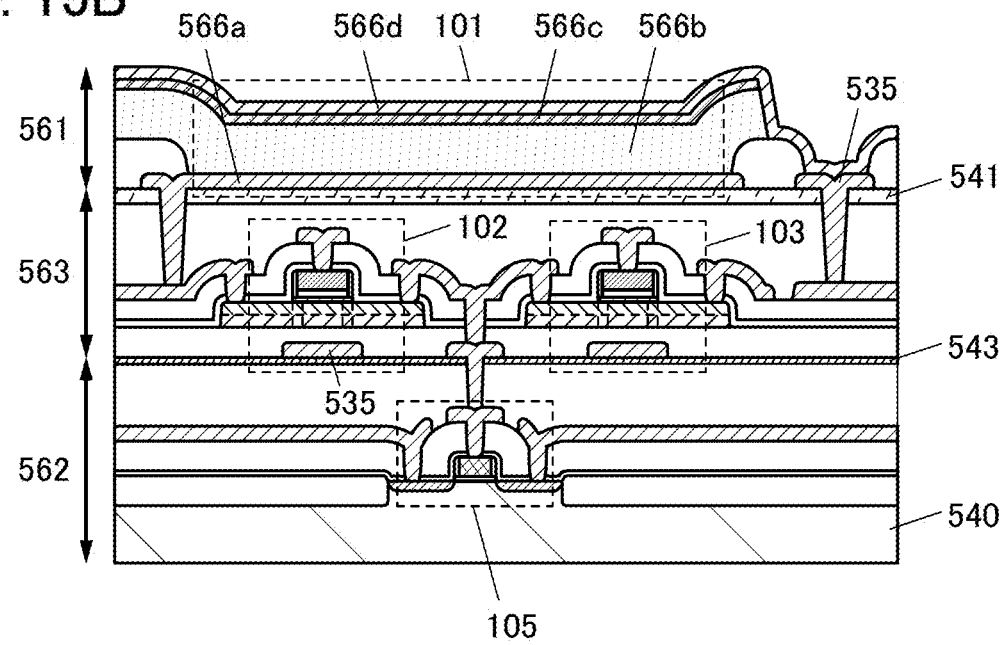

FIG. 15(B) is a cross-sectional view of the case where a pn-junction photodiode that uses a selenium-based material as a photoelectric conversion layer is used for the layer 561 of the pixel illustrated in FIG. 13(B). The layer 561 can be directly formed on the layer 563. The above description can be referred to for the details of the layers 561, 562, and 563.

FIG. 17(A) is a perspective view illustrating an example in which a color filter and the like are added to the pixel of the imaging device of one embodiment of the present invention. In the perspective view, cross sections of the plurality of pixels are also illustrated. An insulating layer 580 is formed over the layer 561 where the photoelectric conversion element 101 is formed. As the insulating layer 580, a silicon oxide film with a high visible light-transmitting property can be used, for example. A silicon nitride film may be stacked as a passivation film. A dielectric film of hafnium oxide or the like may be stacked as an anti-reflection film.

A light-blocking layer 581 may be formed over the insulating layer 580. The light-blocking layer 581 has a function of preventing color mixing of light passing through the upper color filter. As the light-blocking layer 581, a metal layer of aluminum, tungsten, or the like can be used. The metal layer and a dielectric film having a function of an anti-reflection film may be stacked.

An organic resin layer 582 can be provided as a planarization film over the insulating layer 580 and the light-blocking layer 581. A color filter 583 (color filters 583a, 583b, and 583c) is formed in each pixel. When colors of R (red), G (green), B (blue), Y (yellow), C (cyan), and M (magenta) are assigned to the color filters 583a, 583b, and 583c, for example, a color image can be obtained.

An insulating layer 586 or the like having a visible light-transmitting property can be provided over the color filter 583.

As illustrated in FIG. 17(B), an optical conversion layer 585 may be used instead of the color filter 583. Such a structure enables the imaging device capable of obtaining images in various wavelength regions.

When a filter that blocks light with a wavelength shorter than or equal to that of visible light is used as the optical conversion layer 585, for example, it is possible to obtain an infrared imaging device. When a filter that blocks light with a wavelength shorter than or equal to that of near infrared light is used as the photoelectric conversion layer 585, it is possible to obtain a far-infrared imaging device. When a filter that blocks light with a wavelength longer than or equal to that of visible light is used as the photoelectric conversion layer 585, it is possible to obtain an ultraviolet imaging device.

Furthermore, when a scintillator is used as the optical conversion layer 585, it is possible to obtain an imaging device that obtains an image visualizing the intensity of radiation and is used for an X-ray imaging device or the like. Radiations such as X-rays that pass through an object to enter a scintillator are converted into light (fluorescence) such as visible light or ultraviolet light owing to a photoluminescence phenomenon. Then, the light is detected by the photoelectric conversion element 101, whereby image data is obtained. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S$:Tb, $Gd_2O_2S$:Pr, $Gd_2O_2S$:Eu, $BaFCl$:Eu, NaI, CsI, $caF_2$, $BaF_2$, $CeF_3$, LiF, LiI, ZnO, or the like is dispersed.

In the photoelectric conversion element 101 using a selenium-based material, radiation such as X-rays can be directly converted into charge; thus, a structure in which the scintillator is unnecessarily can also be employed.

As illustrated in FIG. 17(C), a microlens array 584 may be provided over the color filter 583. Light passing through lenses of the microlens array 584 goes through the color filter 583 positioned thereunder and the photoelectric conversion element 101 is irradiated with the light. The microlens array 584 may be provided over the optical conversion layer 585 illustrated in FIG. 17(B).

Hereinafter, examples of a package and a camera module in each of which an image sensor chip is placed will be described. For the image sensor chip, the structure of the above-described imaging device can be used.

FIG. 18(A1) is an external perspective view of the top surface side of a package in which an image sensor chip is placed. The package includes a package substrate 410 to which an image sensor chip 450 is fixed, a cover glass 420, an adhesive 430 for bonding the package substrate 410 and the cover glass 420, and the like.

FIG. 18(A2) is an external perspective view of the bottom surface side of the package. A BGA (Ball grid array) in which solder balls serve as bumps 440 is provided on the bottom surface of the package. Note that, not limited to the BGA, an LGA (Land grid array), a PGA (Pin Grid Array), or the like may be provided.

FIG. 18(A3) is a perspective view of the package, in which some parts of the cover glass 420 and the adhesive 430 are not illustrated. Electrode pads 460 are formed over the package substrate 410, and the electrode pads 460 and the bumps 440 are electrically connected via through-holes. The electrode pads 460 are electrically connected to the image sensor chip 450 through wires 470.

Furthermore, FIG. 18(B1) is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 having functions of a driver circuit, a signal conversion circuit, and the like of an imaging device is provided between the package substrate 411 and the image sensor chip 451; thus, the structure as an SiP (System in package) is included.

FIG. 18(B2) is an external perspective view of the bottom surface side of the camera module. On the bottom surface and side surfaces of the package substrate 411, a QFN (Quad flat no-lead package) structure in which lands 441 for mounting are provided is used. Note that this structure is an example, and a QFP (Quad flat package) or the above-mentioned BGA may be employed.

FIG. 18(B3) is a perspective view of the module, in which some parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 3

As electronic devices that can use an imaging device of one embodiment of the present invention, display devices, personal computers, image memory devices or image reproducing devices provided with a recording medium, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 19 illustrates specific examples of these electronic devices.

Figure 19A:
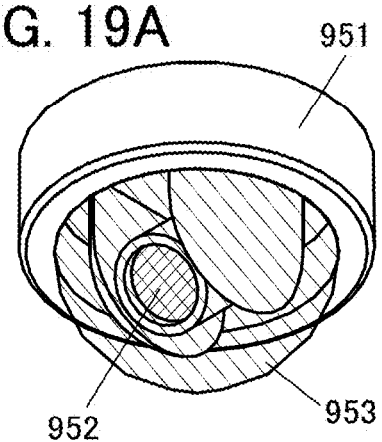
FIGS. 19A-19F Diagrams illustrating electronic devices.

FIG. 19(A) is a surveillance camera which includes a support base 951, a camera unit 952, a protective cover 953, and the like. The camera unit 952 is provided with a rotation mechanism and the like and can capture an image of all of the surroundings when provided on a ceiling. The imaging device of one embodiment of the present invention can be included as a component for obtaining an image in the camera unit. Note that a surveillance camera is a common name and does not limit the use thereof. A device that has a function of a surveillance camera is also referred to as a camera or a video camera, for example.

Figure 19B:
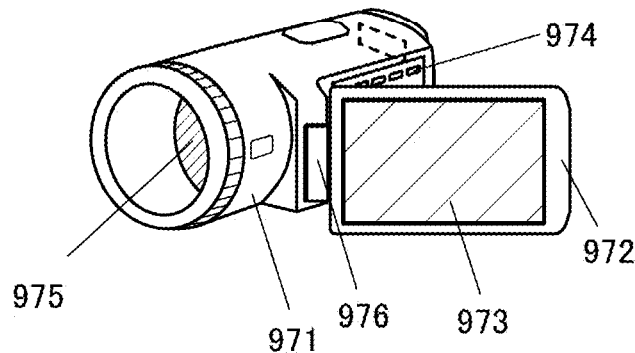

FIG. 19(B) is a video camera which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included as a component for obtaining an image in the video camera.

Figure 19C:
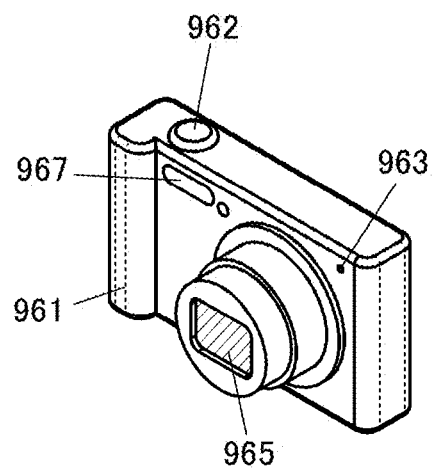

FIG. 19(C) is a digital camera which includes a housing 961, a shutter button 962, a microphone 963, a light-emitting portion 967, a lens 965, and the like. The imaging device of one embodiment of the present invention can be included as a component for obtaining an image in the digital camera.

Figure 19D:
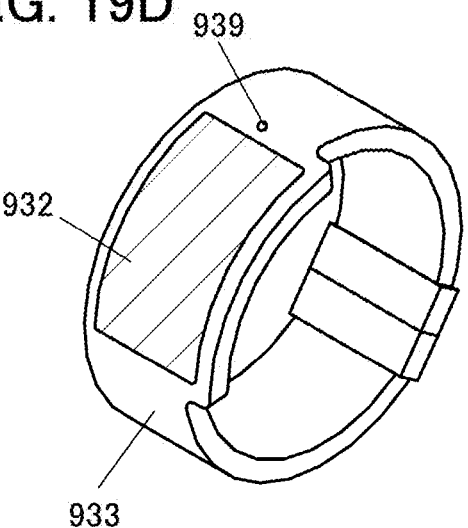

FIG. 19(D) is a wrist-watch-type information terminal which includes a display portion 932, a housing 933 also serving as a wristband, a camera 939, and the like. The display portion 932 is provided with a touch panel for operating the information terminal. The display portion 932 and the housing 933 also serving as a wristband have flexibility and fit a body well. The imaging device of one embodiment of the present invention can be included as a component for obtaining an image in the information terminal.

Figure 19E:
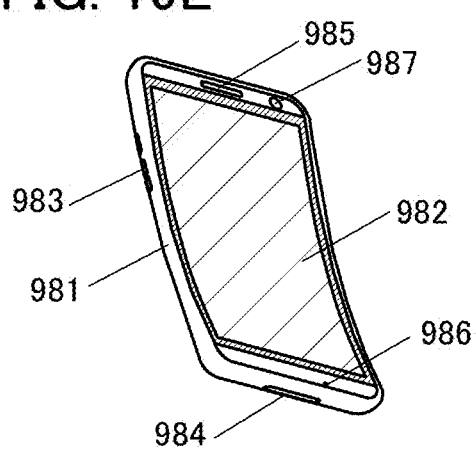

FIG. 19(E) is an example of a cellular phone which includes a housing 981, a display portion 982, an operation button 983, an external connection port 984, a speaker 985, a microphone 986, a camera 987, and the like. The display portion 982 of the cellular phone includes a touch sensor. All operations including making a call and inputting text can be performed by touch on the display portion 982 with a finger, a stylus, or the like. The imaging device of one embodiment of the present invention can be included as a component for obtaining an image in the cellular phone.

Figure 19F:
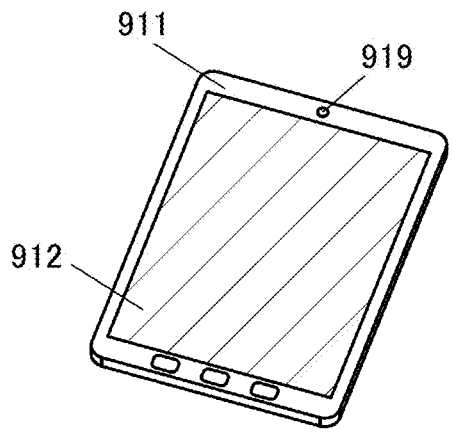

FIG. 19(F) is a portable data terminal which includes a housing 911, a display portion 912, a camera 919, and the like. Input and output of information can be performed by a touch panel function of the display portion 912. The imaging device of one embodiment of the present invention can be included as a component for obtaining an image in the portable data terminal.

This embodiment can be combined with any of the other embodiments as appropriate.

Example

In this example, an imaging device having the structure of one embodiment of the present invention described in Embodiment 1 was prototyped. Results of image processing in the imaging device will be described.

Figure 20:
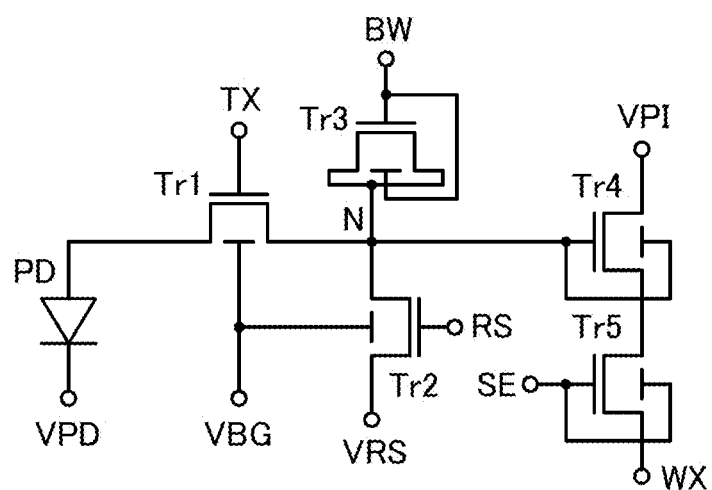
FIG. 20 A diagram illustrating a pixel circuit.

FIG. 20 illustrates a pixel circuit (corresponding to the pixel 100) of the prototyped imaging device. The imaging device described in Embodiment 1 has a structure of extracting the product (WX) of image data (potential X) and a weight coefficient (potential W) from a difference between the output of the pixels 100 and the output of the reference pixels 150, while the prototyped imaging device has a structure which is not provided with the reference pixels 150 and extracts WX by performing double sampling with and without the input of the weight coefficient (potential W) and calculating the difference therebetween at the outside.

The prototyped imaging device has a pixel circuit including a photodiode PD and transistors Tr1, Tr2, Tr3, Tr4, and Tr5. The connection structure thereof is as illustrated in FIG. 20. Here, the transistor Tr3 has a structure in which a source and a drain are short-circuited and operates as a capacitor (MOS Capacitor). Selenium was used for a photoelectric conversion layer of the photodiode PD. As the transistors Tr1, Tr2, Tr3, Tr4, and Tr5, OS transistors were formed. The other specifications are shown in Table 1.

TABLE 1

| | |
|---|---|
| Image sensor's external dimensions | 30 mm (H) × 40 mm (V) |
| Captured area size | 23.04 mm (H) × 23.04 mm (V) |
| Number of pixels | 256 (H) × 256 (V) |
| Pixel size | 90 mm (H) × 90 mm (V) |
| Pixel configuration | PD (Se) + 4 OS-FET + 1 MOS Capasitor |
| Peripheral circuit | Row and column drivers: shift register method, |
| Read circuit | CDS source follower |
| Output mode | 8ch analog voltage, sequential output |

TX, RS, and SE are signal potentials for driving the transistors. VPD, VRS, and VPI are power supply potentials; VPD and VPI are high potentials; and VRS is a low potential. VBG is a back gate potential for adjusting the threshold voltages of the transistors Tr1 and Tr2. BW corresponds to a weight coefficient (potential W) and is added to the node N by capacitive coupling.

Double sampling operation is as follows. First, the transistors Tr1 and Tr2 are turned on to reset the node N. After the transistor Tr2 is turned off, the potential of the node N is changed by the operation of the photodiode PD. Next, the transistor Tr1 is turned off and BW is supplied as a desired weight coefficient, so that the potential of the node N is determined. Then, the transistor Tr5 is turned on, and a first image signal is taken to the outside.

Next, BW is returned to an initial value, and a second image signal is taken to the outside. Then, a difference between the first image signal and the second image signal is calculated and WX is extracted. Note that the order of obtaining the first image signal and the second image signal may be reversed.

Figure 21:
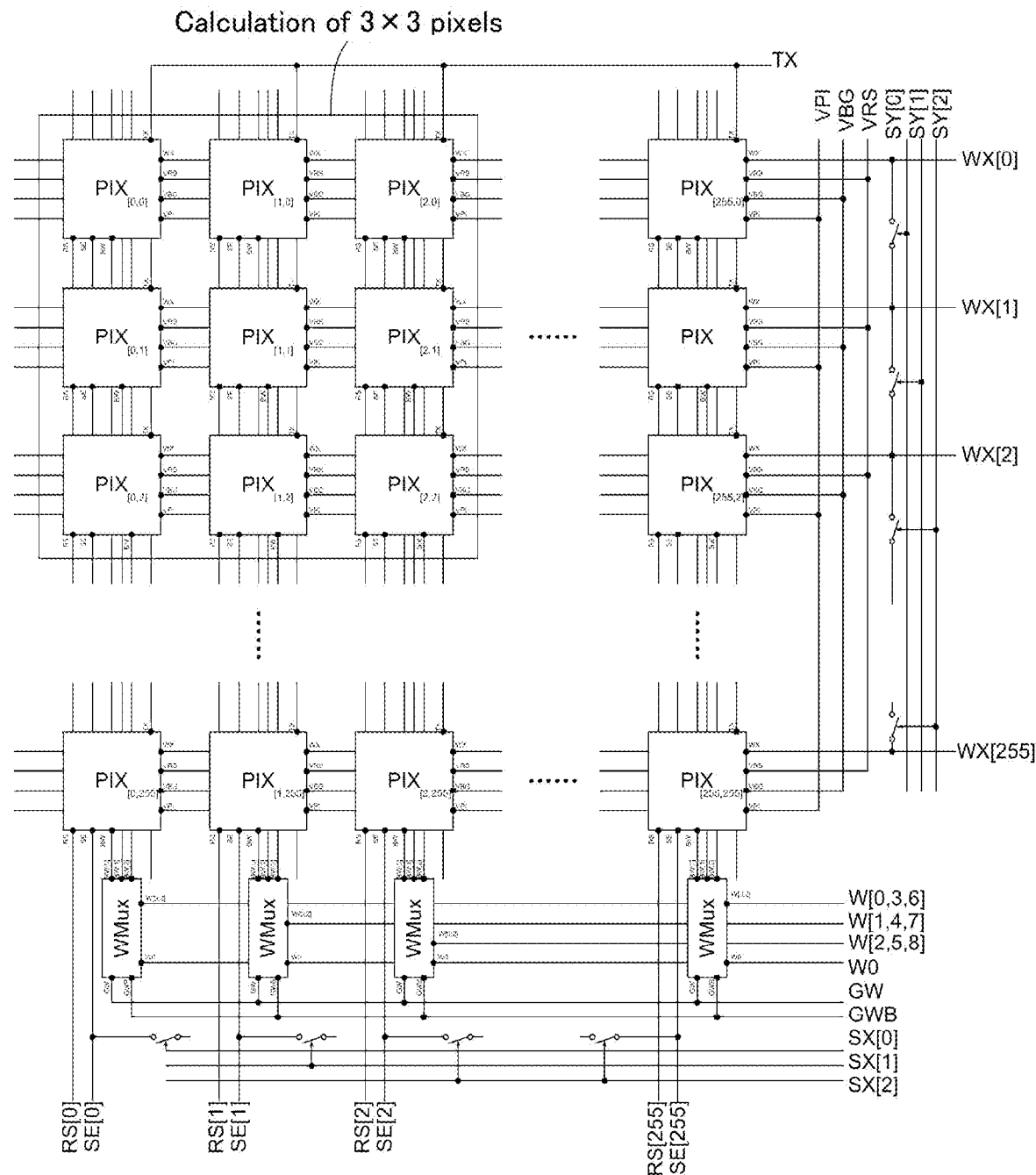
FIG. 21 A block diagram of a pixel array.

FIG. 21 is a block diagram of a pixel array showing pixels PIX included in the above pixel circuit and paths of various signals. Note that WMux is a selection circuit which outputs BW corresponding to a weight coefficient and includes a transistor corresponding to the transistor 106 illustrated in FIG. 3.

Figure 22:
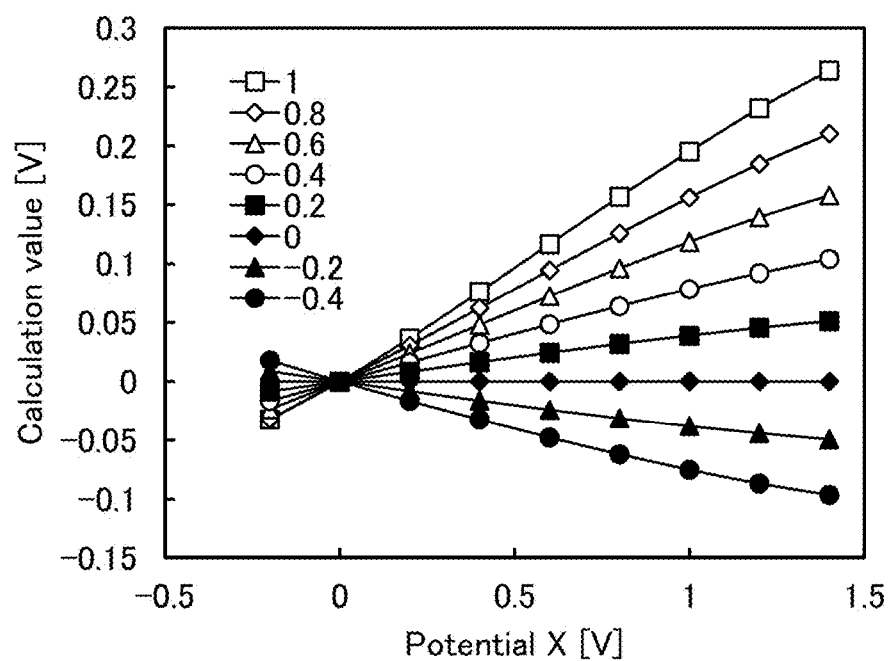
FIG. 22 A graph showing calculation results.

FIG. 22 shows calculation results with respect to image data (potential X: −0.2 to 1.4 V) obtained when the weight coefficient (potential W) is changed between 0.4 and 1.0 V. At this time, VRES was set at 1.2 V. From FIG. 22, it was confirmed that desired calculation was possible.

Figure 23:
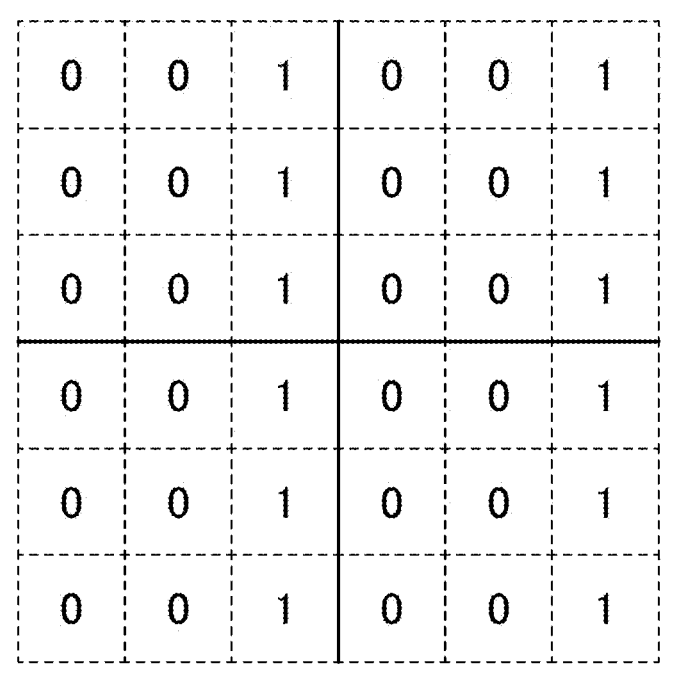
Figure 24:
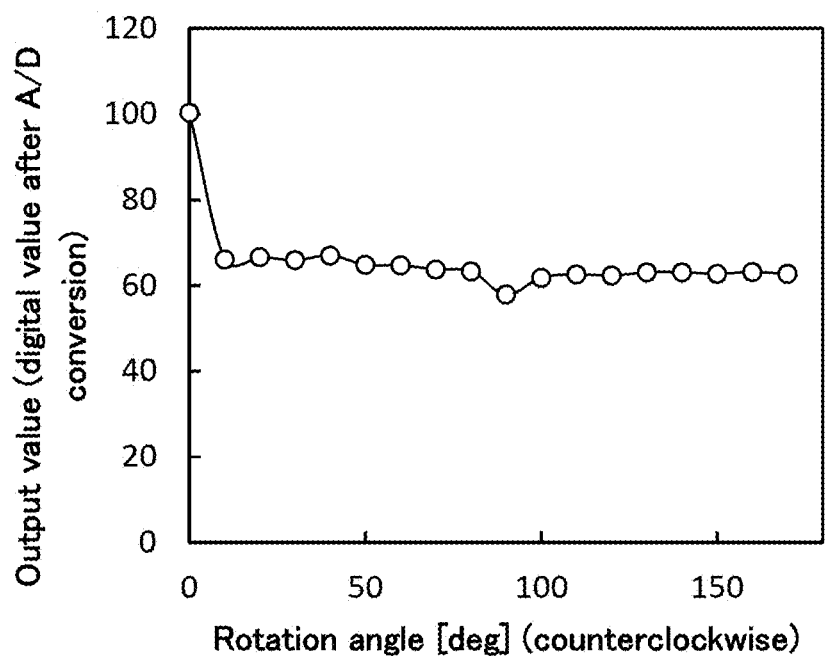
FIG. 24 A graph explaining the output of pixels.

Moreover, results of applying weight coefficients having directivity as illustrated in FIG. 23 to respective pixels in capturing an image of an object having a vertical stripe pattern are shown in FIG. 24. In FIG. 24, the horizontal axis represents the rotation angle (no rotation: 0°) of the vertical stripe pattern, and the vertical axis represents the digital value after A/D conversion of the output WX. FIG. 24 demonstrates that the output value is large when the direction of the vertical stripe agrees with the directivity of the weight coefficients.

Figures 25A, 25B, 25C:
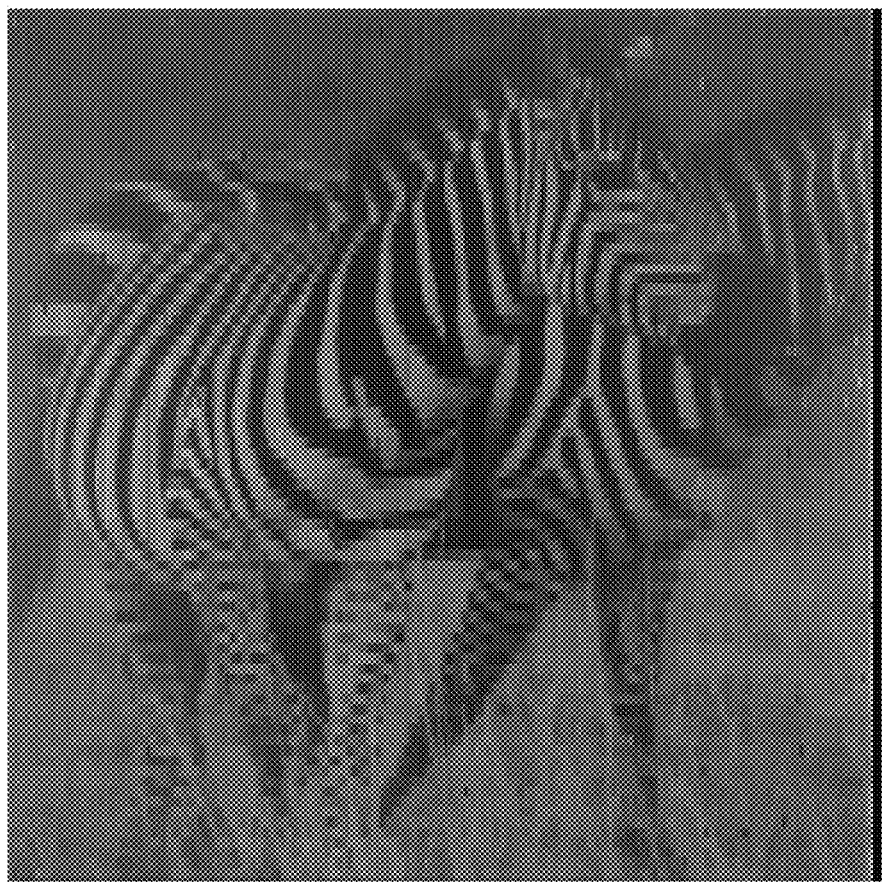
FIGS. 25A-25C An image used for pattern extraction and diagrams showing weight coefficients input to pixels.

From the results, it can be assumed that a pattern can be extracted from an image, and the assumption was tested. FIG. 25(A) is an image of a zebra captured with a certain weight. Weight coefficients having directivity in a vertical direction and weight coefficients having directivity in a horizontal direction are applied to the image as illustrated in FIG. 25(A) and FIG. 25(B), respectively, and the pattern detection was tested. Note that in FIGS. 25(A) and 25(B), a positive weight coefficient was +0.8 V, and a negative weight coefficient was −0.4 V.

Figure 26A:
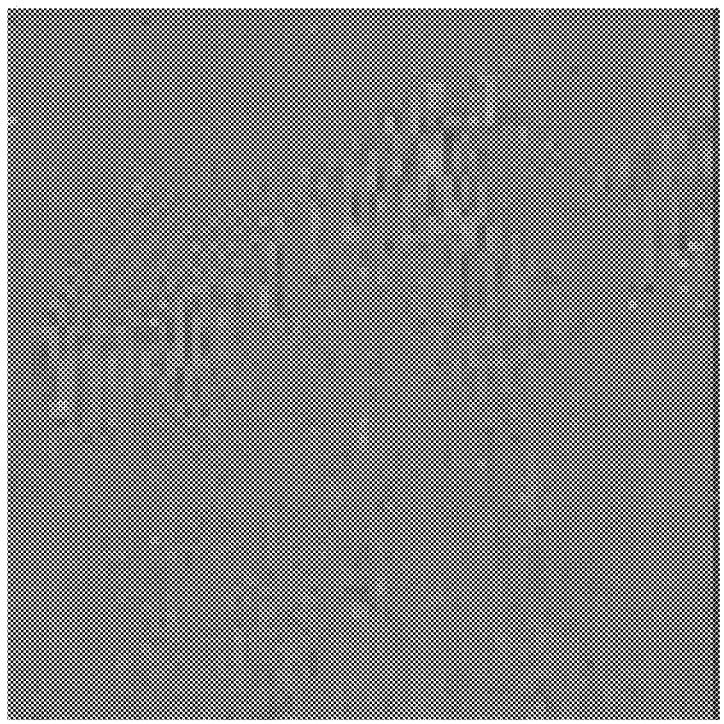
FIGS. 26A and 26B Diagrams illustrating pattern extraction results.
Figure 26B:
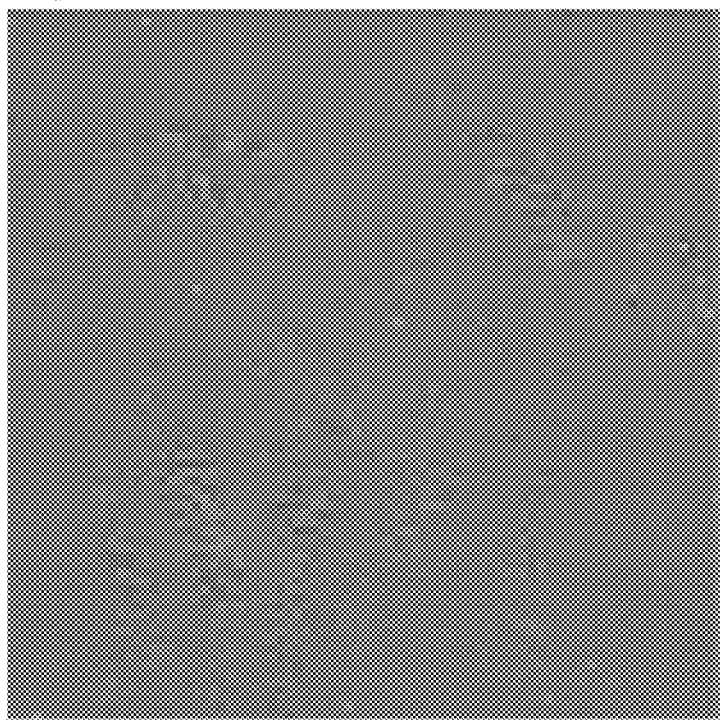

FIGS. 26(A) and 26(B) show results of visualizing the extracted patterns. FIG. 26(A) shows the result corresponding to FIG. 24(A), where a vertical stripe pattern of the zebra is extracted. Furthermore, FIG. 26(A) shows the result corresponding to FIG. 25(B), where a horizontal stripe pattern of the zebra is extracted.

In the above-described manner, it was confirmed that image processing (recognition of an image pattern) was able to be performed with one embodiment of the present invention.

REFERENCE NUMERALS

100: pixel, 100a: pixel, 100b: pixel, 100c: pixel, 100d: pixel, 100e: pixel, 100f: pixel, 100g: pixel, 100h: pixel, 101: photoelectric conversion element, 102: transistor, 103: transistor, 104: capacitor, 105: transistor, 106: transistor, 107: transistor, 108: transistor, 109: transistor, 111: wiring, 111a: wiring, 111b: wiring, 112: wiring, 112_1: wiring, 112_2: wiring, 112_4: wiring, 113: wiring, 114: wiring, 115: wiring, 116: wiring, 117: wiring, 118: wiring, 119: wiring, 120: wiring, 121: wiring, 150: reference pixel, 151: light-shielding layer, 153: wiring, 161: transistor, 162: transistor, 163: capacitor, 200: pixel block, 200a: pixel block, 200b: pixel block, 200c: pixel block, 200d: pixel block, 200e: pixel block, 200f: pixel block, 201: circuit, 201a: circuit, 201b: circuit, 202: capacitor, 203: transistor, 204: transistor, 205: transistor, 206: transistor, 207: resistor, 210: current source circuit, 211: wiring, 212: wiring, 212_1: wiring, 212_2: wiring, 213: wiring, 213_1: wiring, 214: wiring, 214_1: wiring, 214_2: wiring, 215: wiring, 215_1: wiring, 215_2: wiring, 216: wiring, 218: wiring, 219: wiring, 220: circuit, 224: transistor, 253: transistor, 254: transistor, 261: transistor, 262: transistor, 300: pixel array, 301: circuit, 302: circuit, 303: circuit, 304: circuit, 305: circuit, 306: circuit, 311: wiring, 311_1: wiring, 311_2: wiring, 320: memory cell, 325: reference memory cell, 330: circuit, 340: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 531: conductive layer, 532: conductive layer, 533: conductive layer, 534: conductive layer, 535: back gate, 536: region, 540: silicon substrate, 541: insulating layer, 542: insulating layer, 543: insulating layer, 545: semiconductor layer, 546: insulating layer, 561: layer, 562: layer, 563: layer, 565a: layer, 565b: layer, 565c: layer, 566a: layer, 566b: layer, 566c: layer, 566d: layer, 580: insulating layer, 581: light-blocking layer, 582: organic resin layer, 583: color filter, 583a: color filter, 583b: color filter, 583c: color filter, 584: microlens array, 585: optical conversion layer, 586: insulating layer, 911: housing, 912: display portion, 919: camera, 932: display portion, 933: housing also serving as a wristband, 939: camera, 951: support base, 952: camera unit, 953: protective cover, 961: housing, 962: shutter button, 963: microphone, 965: lens, 967: light-emitting portion, 971: housing, 972: housing, 973: display portion, 974: operation key, 975: lens, 976: connection portion, 981: housing, 982: display portion, 983: operation button, 984: external connection port, 985: speaker, 986: microphone, 987: camera

The invention claimed is:

1. An imaging device comprising:
a pixel block comprising a pixel and a second circuit; and
a first circuit,
wherein the pixel is configured to obtain a first signal by photoelectric conversion,
wherein the second circuit is configured to generate a second signal on the basis of a sum of the first signals, and
wherein the first circuit is configured to generate a third signal by binarizing the second signal.

2. The imaging device according to claim 1,
wherein the pixel comprises a photoelectric conversion element, a first transistor, a second transistor, and
wherein the first transistor comprises a metal oxide in a channel formation region.

3. The imaging device according to claim 2,
wherein the second transistor comprises silicon in a channel formation region.

4. The imaging device according to claim 2,
wherein the metal oxide comprises indium, gallium, and zinc.

* * * * *